US009230975B2

(12) United States Patent
Sakuma et al.

(10) Patent No.: US 9,230,975 B2
(45) Date of Patent: Jan. 5, 2016

(54) NONVOLATILE SEMICONDUCTOR MEMORY DEVICE

(71) Applicant: Kabushiki Kaisha Toshiba, Minato-ku (JP)

(72) Inventors: Kiwamu Sakuma, Yokkaichi (JP); Masahiro Kiyotoshi, Yokkaichi (JP); Shosuke Fujii, Kuwana (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/489,700

(22) Filed: Sep. 18, 2014

(65) Prior Publication Data

US 2015/0255479 A1 Sep. 10, 2015

(30) Foreign Application Priority Data

Mar. 4, 2014 (JP) ................................ 2014-041659

(51) Int. Cl.
*H01L 23/52* (2006.01)
*H01L 29/788* (2006.01)
*H01L 29/66* (2006.01)
(Continued)

(52) U.S. Cl.
CPC .... *H01L 27/11556* (2013.01); *H01L 21/02233* (2013.01); *H01L 21/30604* (2013.01); *H01L 21/311* (2013.01)

(58) Field of Classification Search
CPC .................. H01L 27/11521; H01L 27/11565; H01L 27/11578; H01L 21/8221; H01L 27/115
USPC .......... 257/211, 328, 324, E29.309, 202, 319, 257/329; 438/479, 639, 264
See application file for complete search history.

(56) References Cited

U.S. PATENT DOCUMENTS 5,929,479 A 7/1999 Oyama
7,352,018 B2 4/2008 Specht et al.
(Continued)

FOREIGN PATENT DOCUMENTS

JP 10-125810 A 5/1998
JP 2007-266143 A 10/2007
(Continued)

OTHER PUBLICATIONS

US 7,799,616, 09/2010, Shin et al. (withdrawn)

*Primary Examiner* — Long K Tran
*Assistant Examiner* — Dzung Tran
(74) *Attorney, Agent, or Firm* — Oblon, McClelland, Maier & Neustadt, L.L.P.

(57) ABSTRACT

According to one embodiment, a nonvolatile semiconductor memory device includes a semiconductor substrate, a first stacked layer structure including first to $n^{th}$ semiconductor layers (n is a natural number greater than or equal to 2) stacked in a first direction, and extending in a second direction, and first to $n^{th}$ memory cells provided on surfaces of the first to $n^{th}$ semiconductor layers facing a third direction. The $i^{th}$ memory cell ($1 \leq i \leq n$) comprises a second stacked layer structure in which a first insulating layer, a charge storage layer, a second insulating layer, and a control gate electrode are stacked. The second insulating layer has an equivalent oxide thickness smaller than that of the first insulating layer.

16 Claims, 22 Drawing Sheets

(51) Int. Cl.

| | |
|---|---|
| ***H01L 29/792*** | (2006.01) |
| ***H01L 27/115*** | (2006.01) |
| ***H01L 21/306*** | (2006.01) |
| ***H01L 21/311*** | (2006.01) |
| ***H01L 21/02*** | (2006.01) |

(56) References Cited

U.S. PATENT DOCUMENTS

| | | | | |
|---|---|---|---|---|
| 7,382,018 | B2 | 6/2008 | Kim et al. | |
| 7,851,849 | B2 | 12/2010 | Kiyotoshi | |
| 7,867,831 | B2 | 1/2011 | Shin et al. | |
| 2005/0127466 | A1* | 6/2005 | Furukawa et al. | 257/499 |
| 2007/0252201 | A1 | 11/2007 | Kito et al. | |
| 2008/0073635 | A1 | 3/2008 | Kiyotoshi et al. | |
| 2008/0258203 | A1 | 10/2008 | Happ et al. | |
| 2008/0259687 | A1 | 10/2008 | Specht et al. | |
| 2010/0006919 | A1 | 1/2010 | Kim et al. | |
| 2010/0044778 | A1* | 2/2010 | Seol et al. | 257/326 |
| 2010/0155810 | A1* | 6/2010 | Kim et al. | 257/316 |
| 2010/0172182 | A1 | 7/2010 | Seol et al. | |
| 2010/0226195 | A1 | 9/2010 | Lue | |
| 2010/0308398 | A1 | 12/2010 | Shin et al. | |
| 2010/0327323 | A1 | 12/2010 | Choi | |
| 2011/0169067 | A1 | 7/2011 | Ernst et al. | |
| 2011/0284946 | A1 | 11/2011 | Kiyotoshi | |
| 2012/0001250 | A1* | 1/2012 | Alsmeier | 257/319 |
| 2012/0168848 | A1* | 7/2012 | Ahn | 257/324 |
| 2012/0280303 | A1 | 11/2012 | Kiyotoshi et al. | |
| 2013/0015519 | A1 | 1/2013 | Fujii et al. | |

FOREIGN PATENT DOCUMENTS

| | | | |
|---|---|---|---|
| JP | 2008-140899 | A | 6/2008 |
| JP | 2009-238874 | A | 10/2009 |
| WO | WO 2010/004047 | A1 | 1/2010 |
| WO | WO 2011/114502 | A1 | 9/2011 |

* cited by examiner

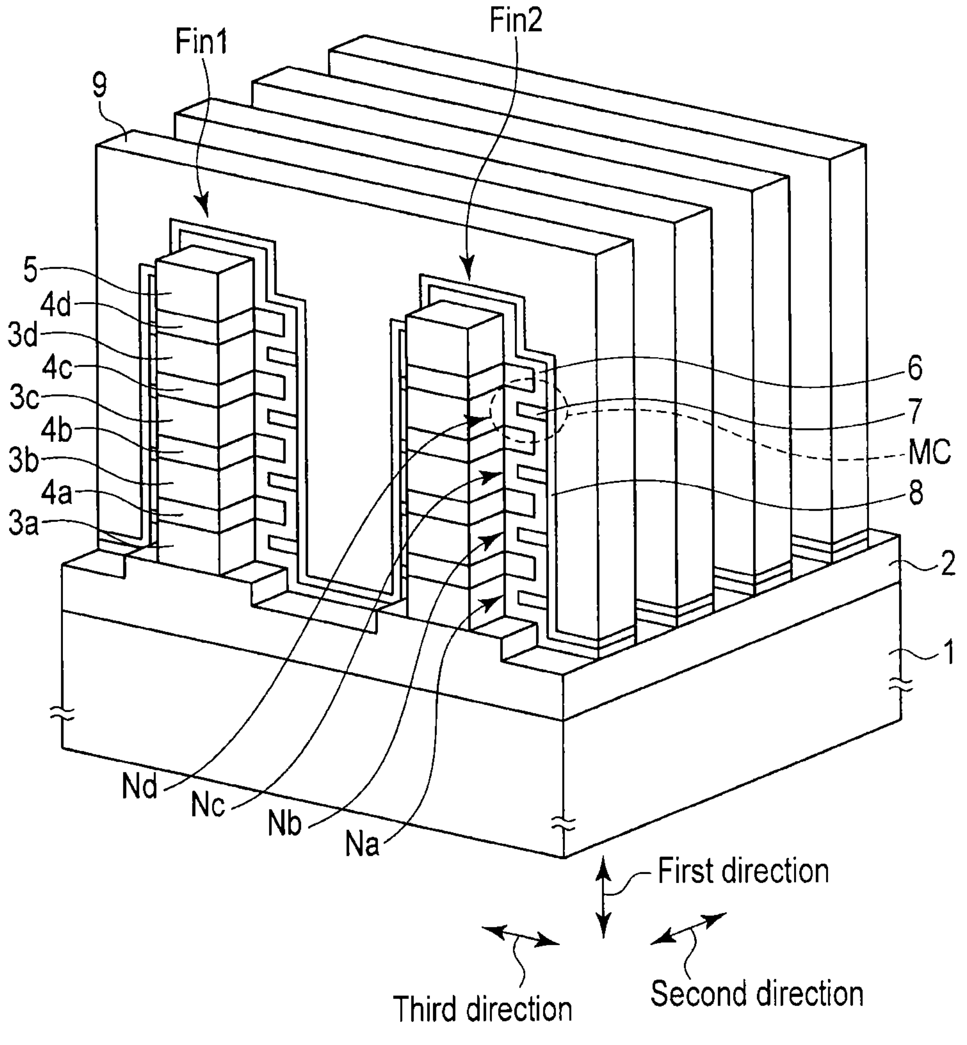
F I G. 1

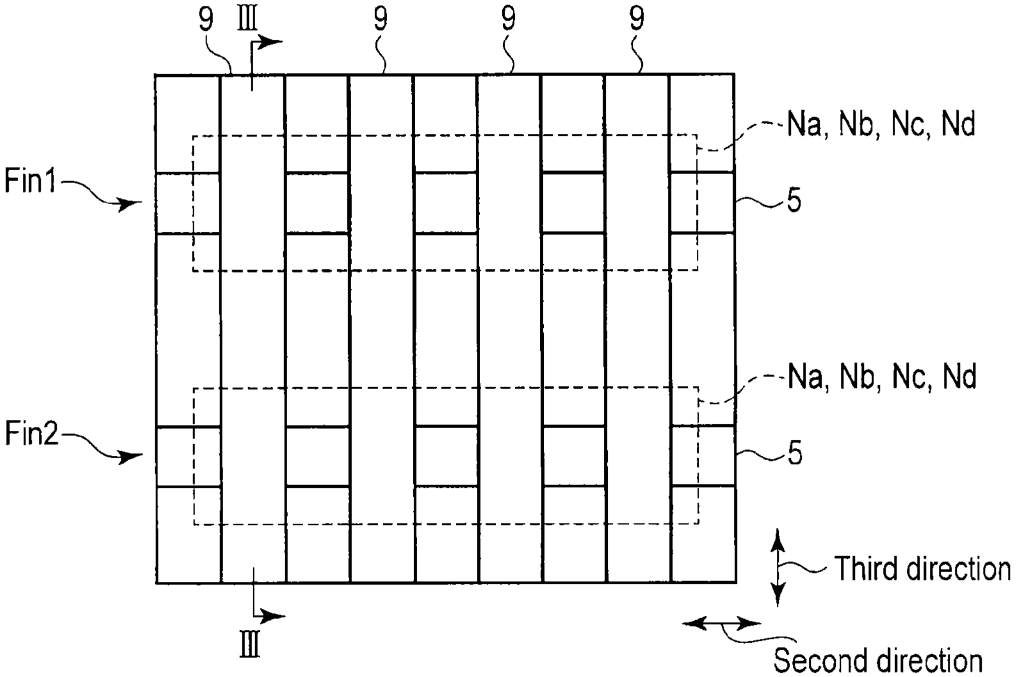
F I G. 2
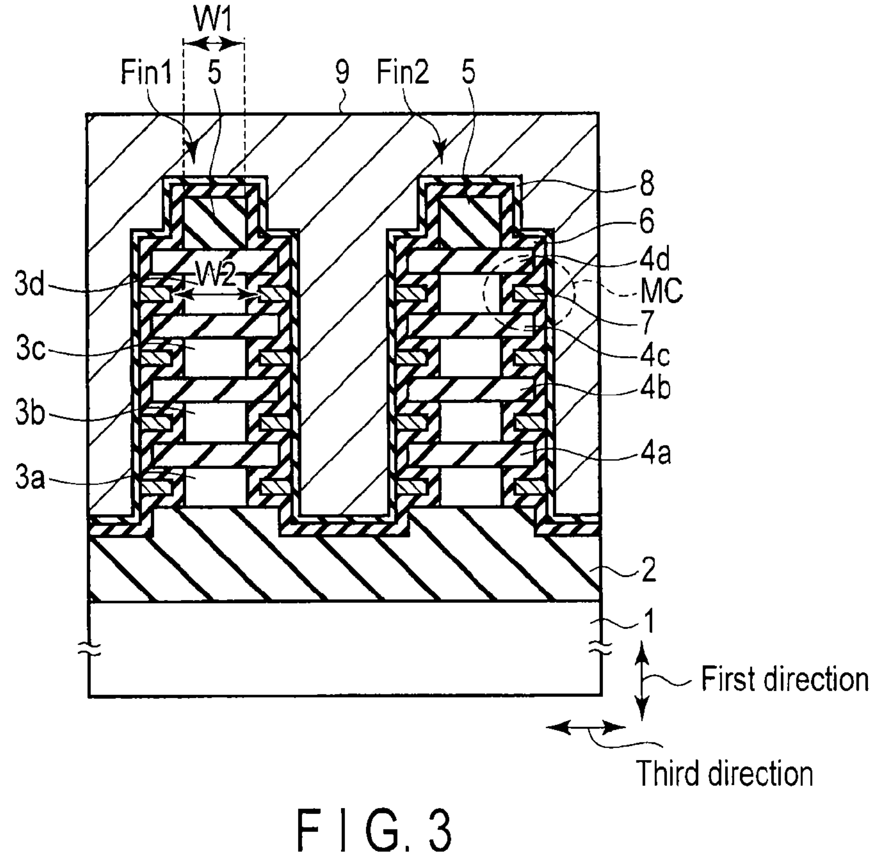
F I G. 3

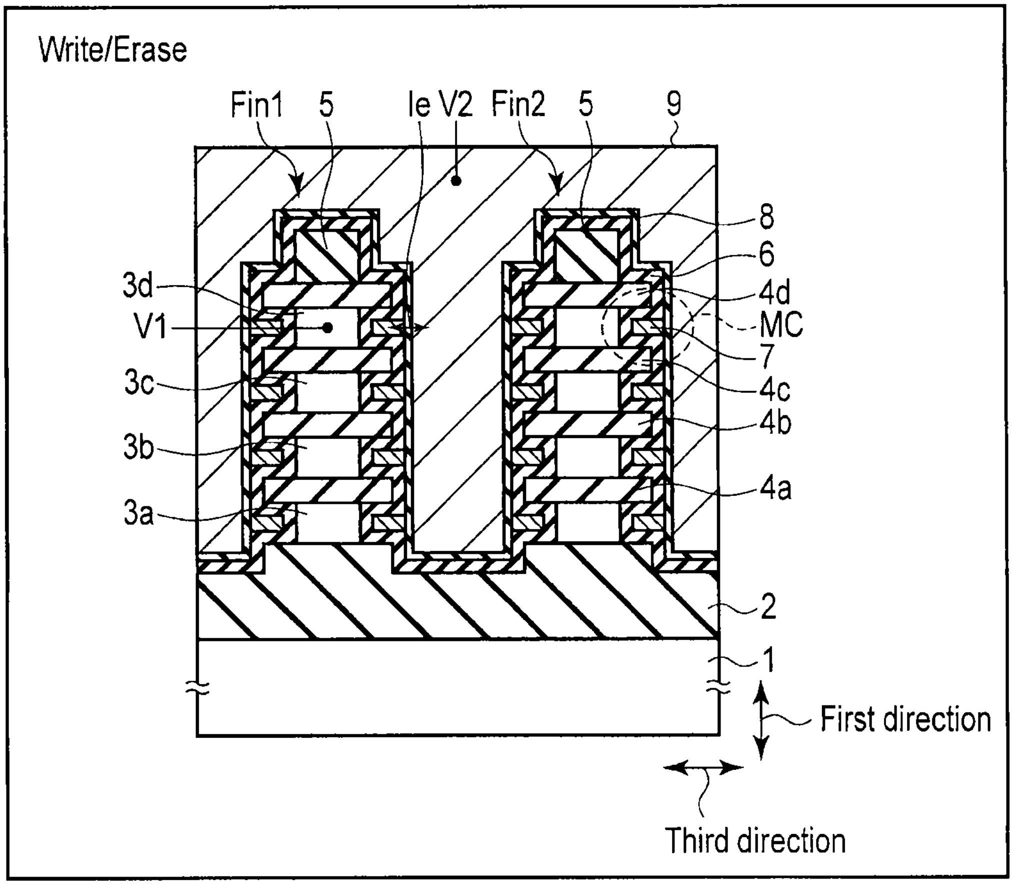
F I G. 4

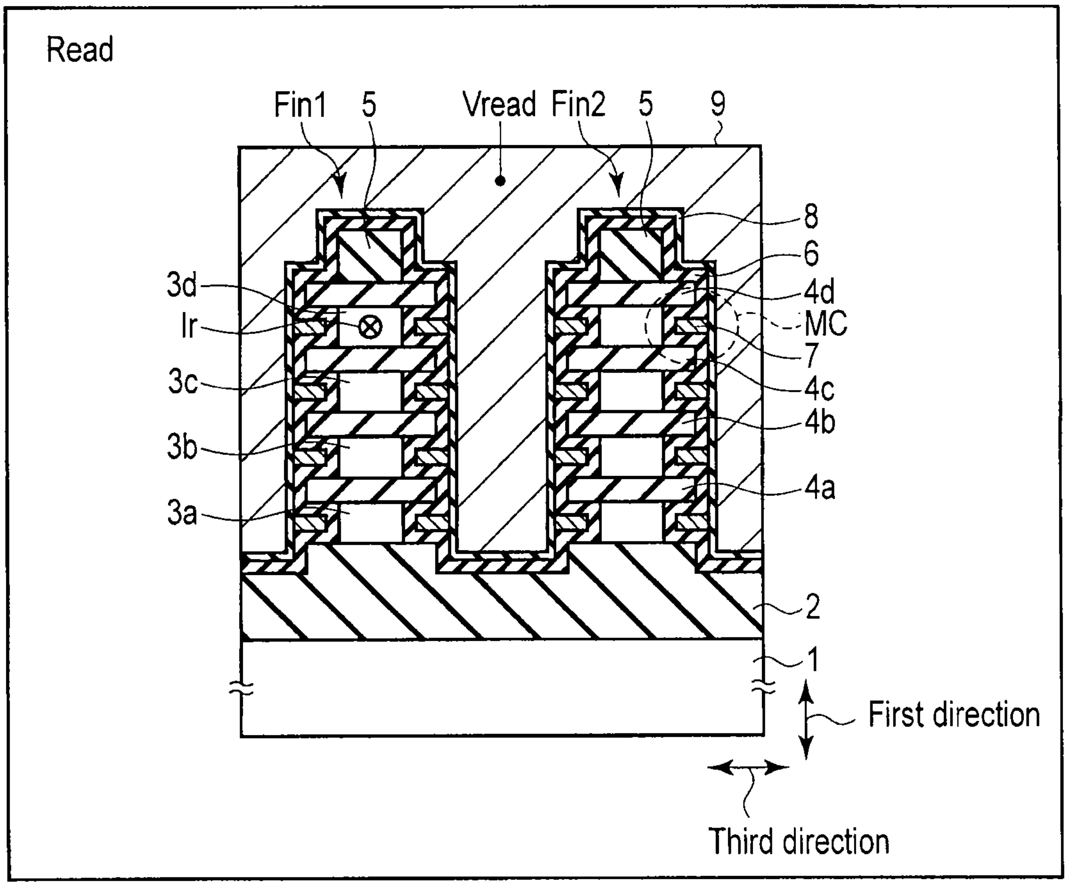
F I G. 5

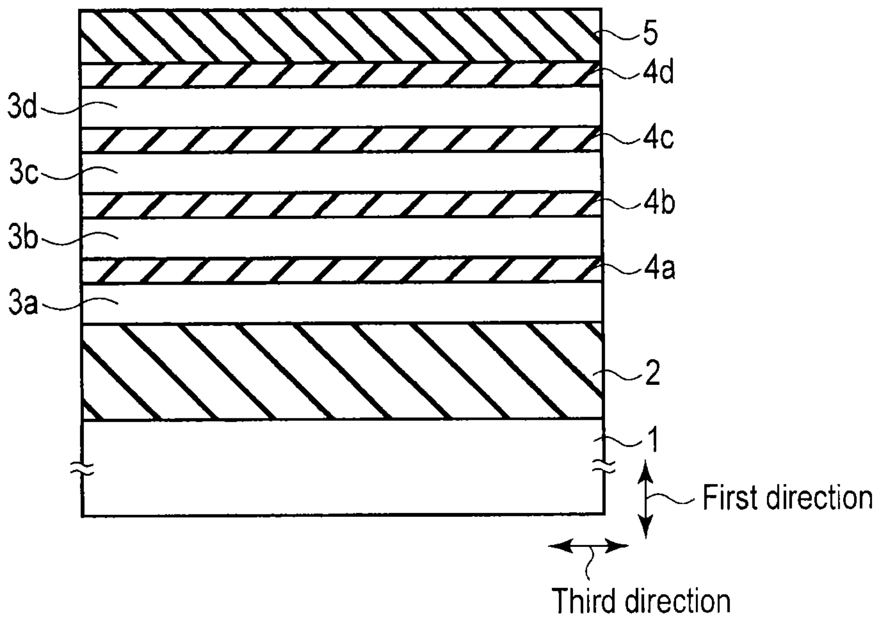
F I G. 6
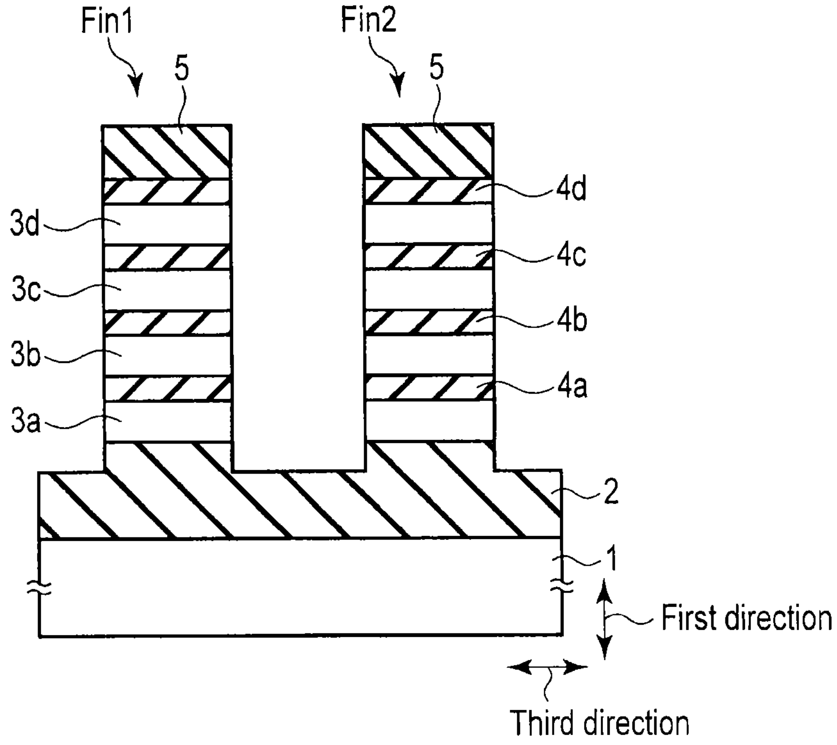
F I G. 7

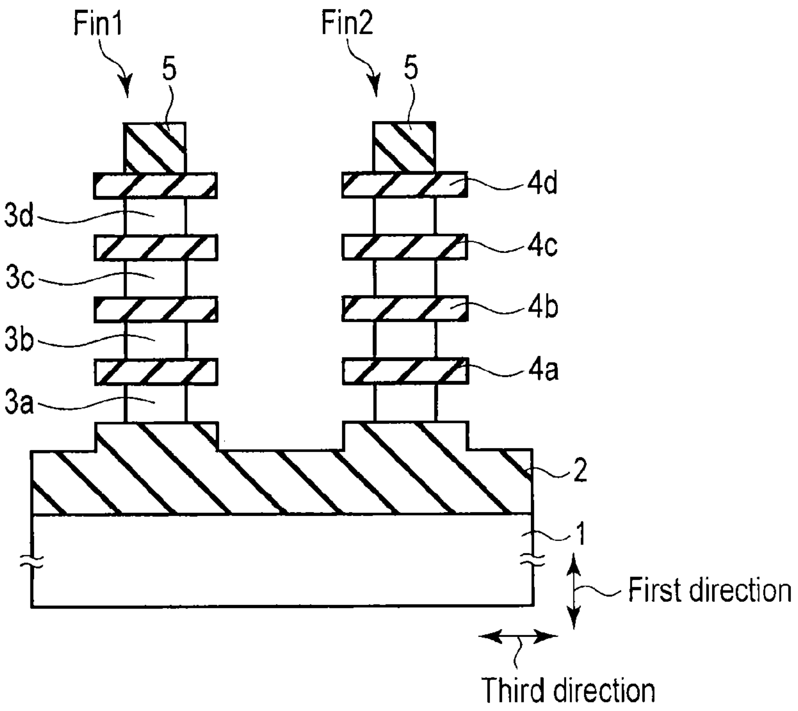
F I G. 8
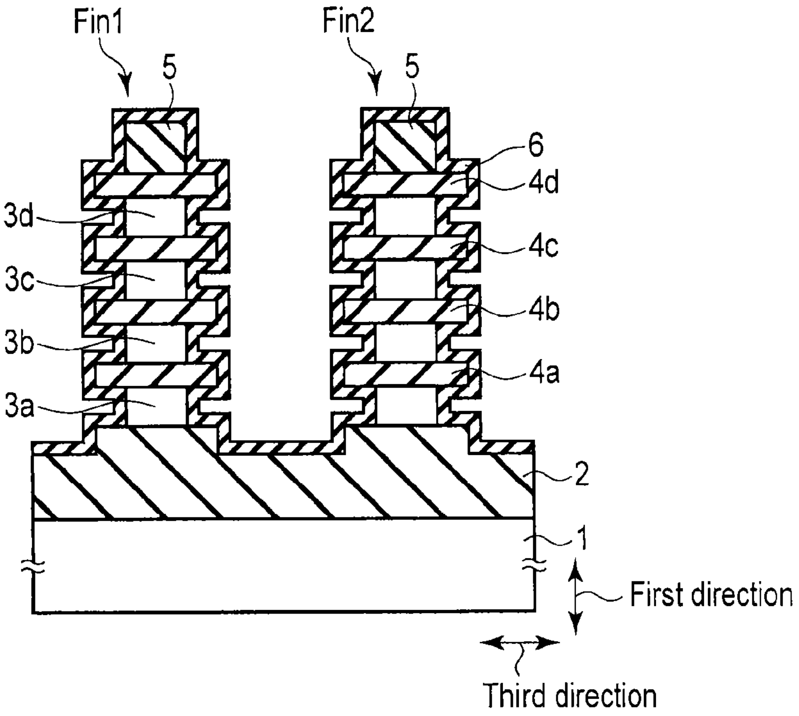
F I G. 9

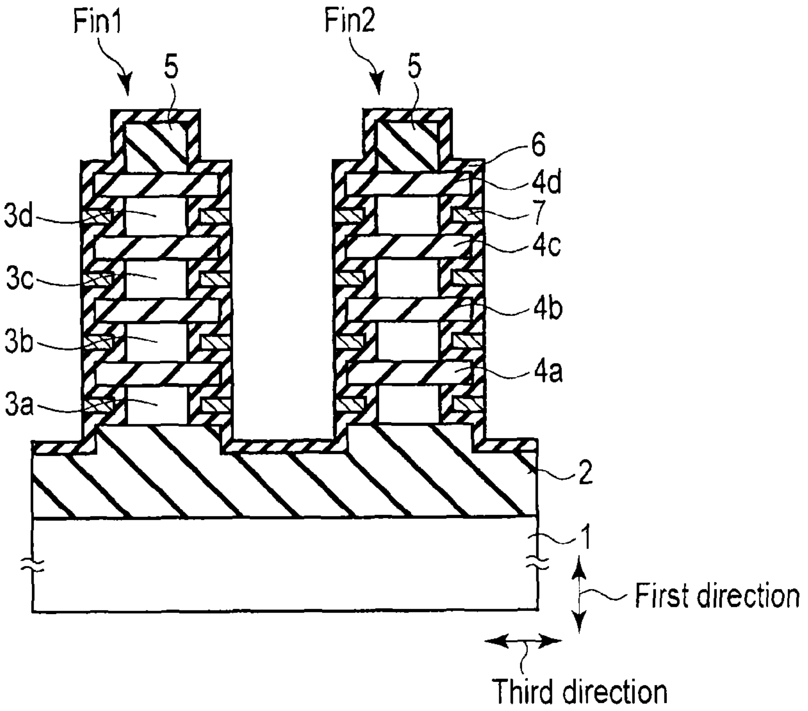
F I G. 10
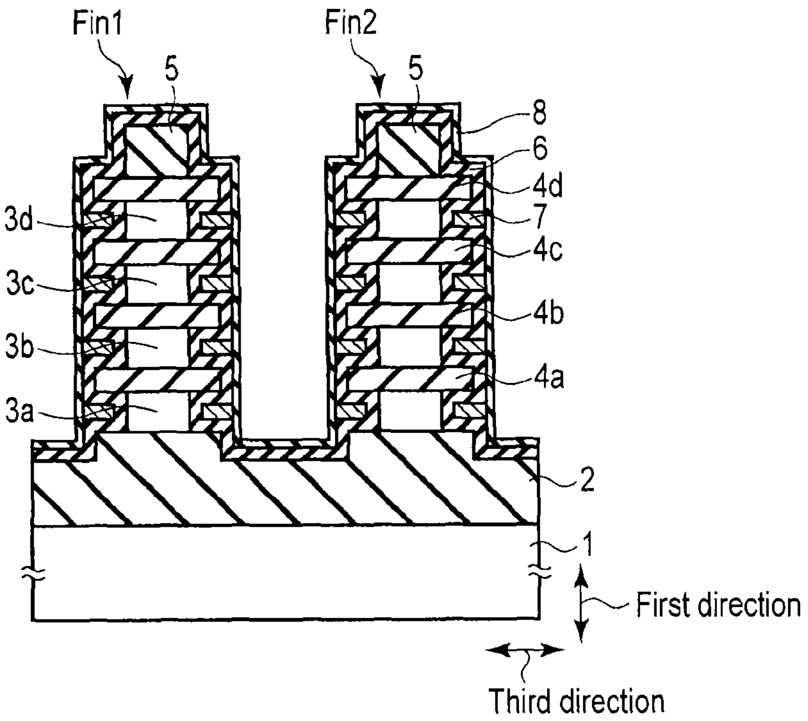
F I G. 11

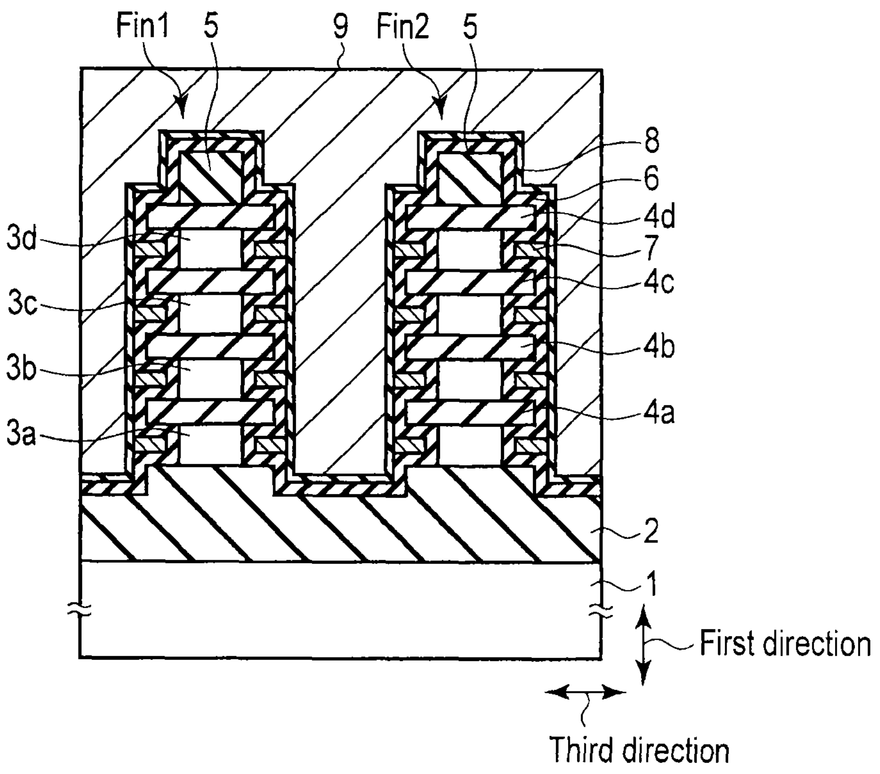
F I G. 12

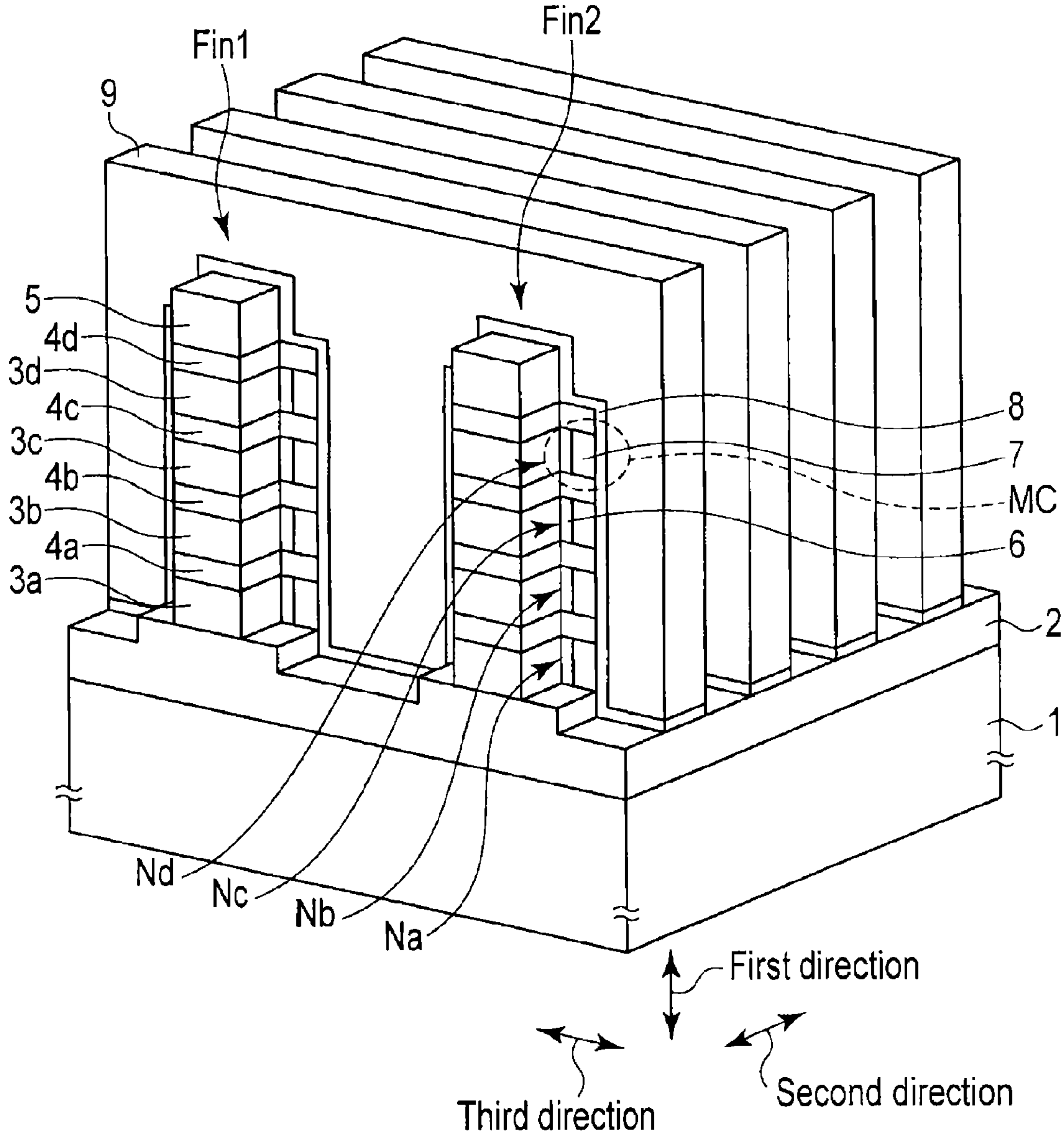
F I G. 13

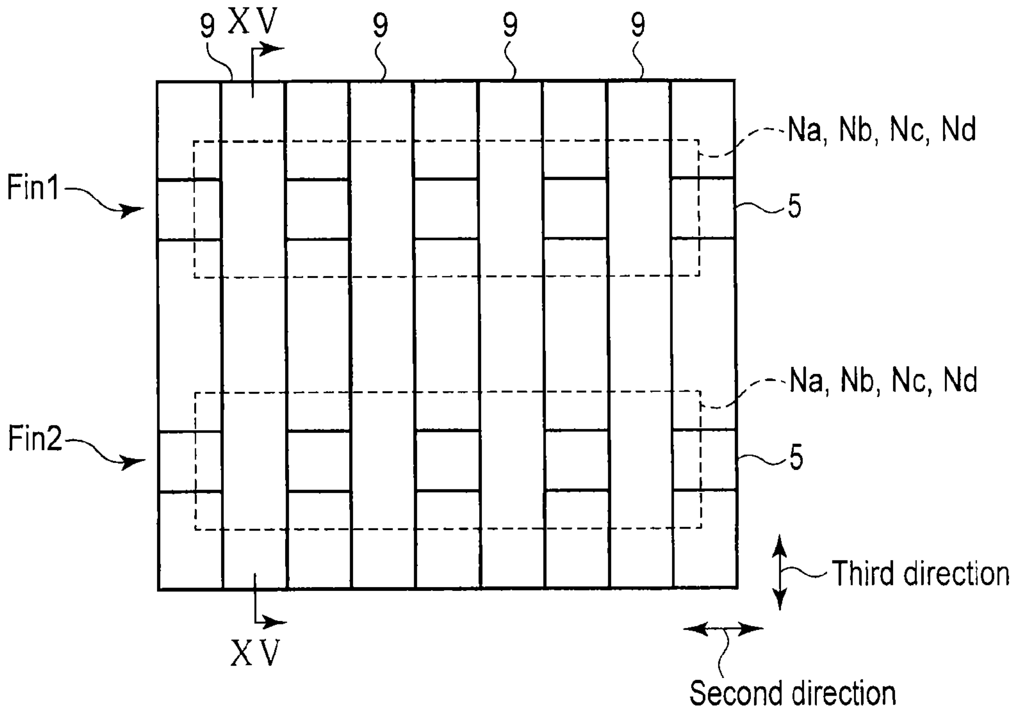
F I G. 14
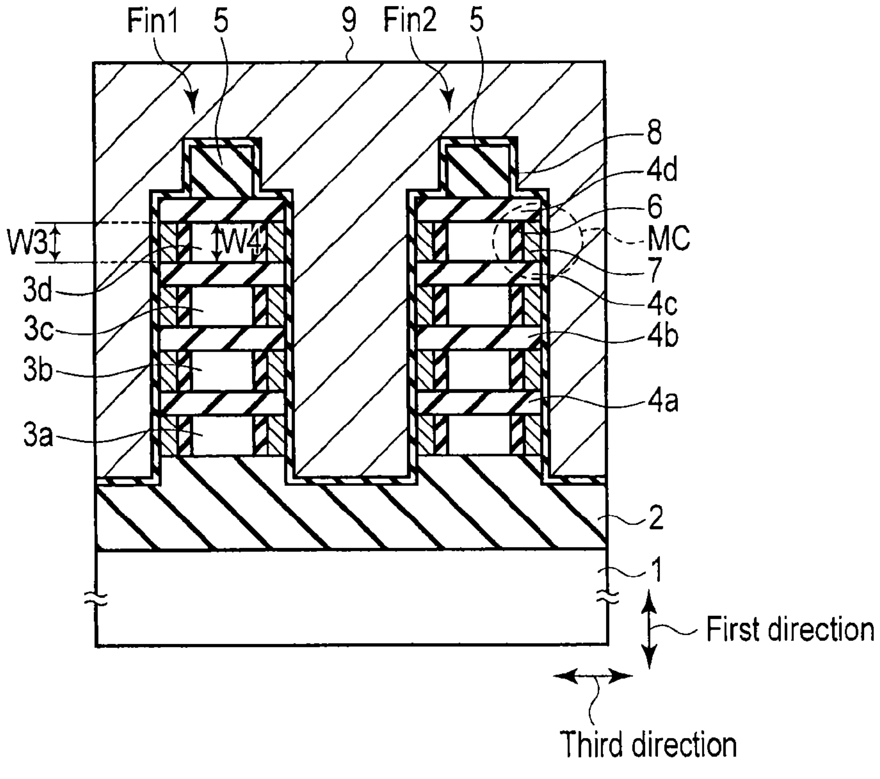
F I G. 15

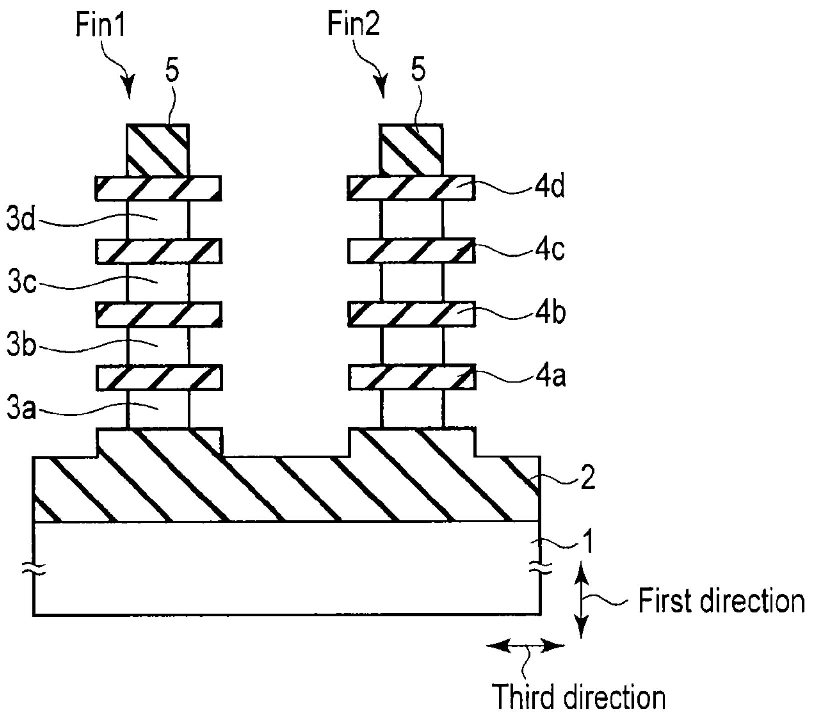
F I G. 16
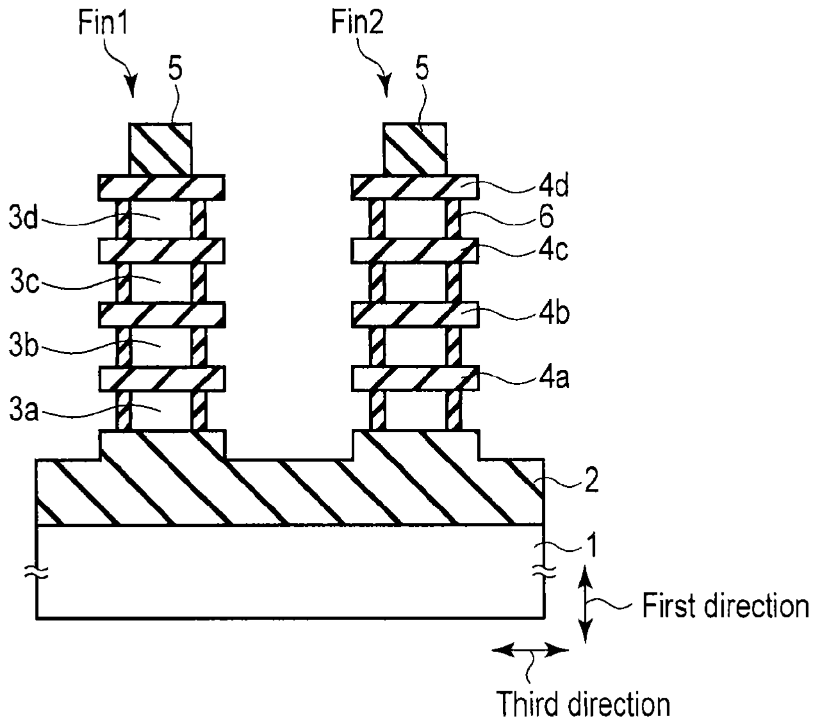
F I G. 17

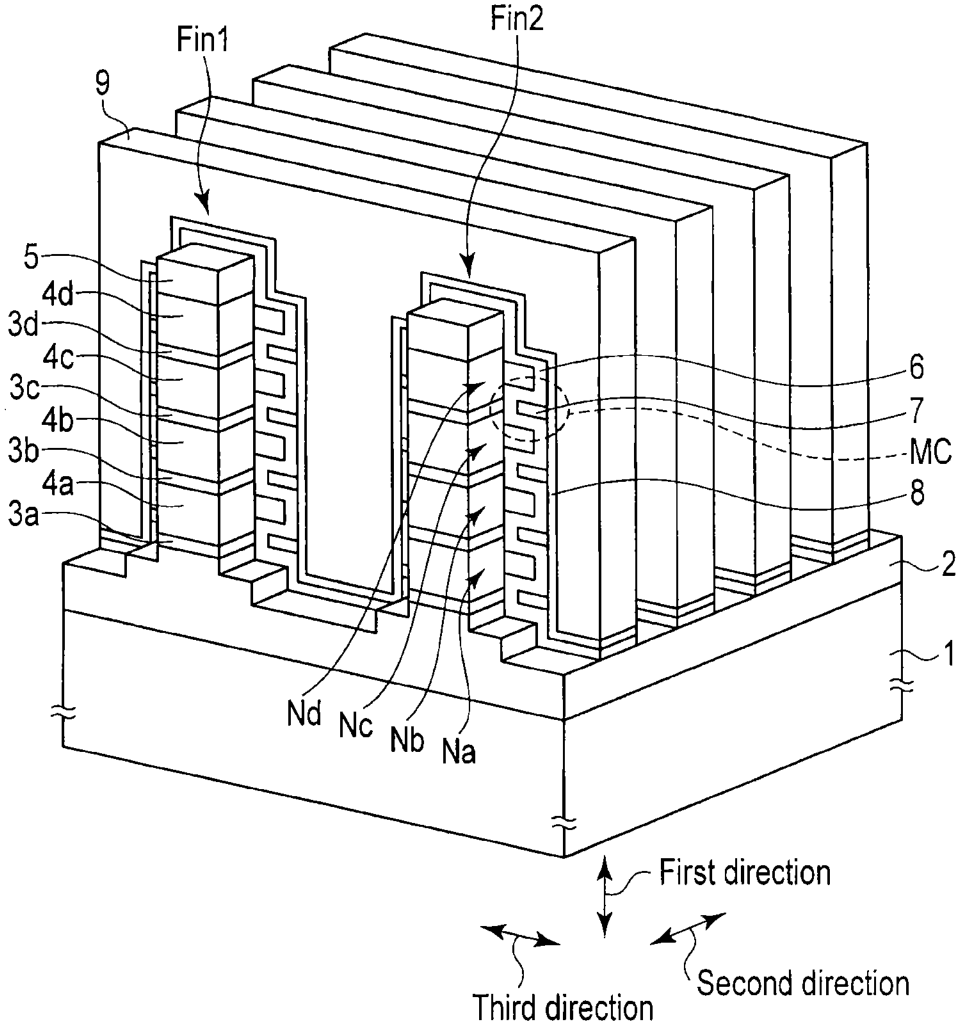
F I G. 18

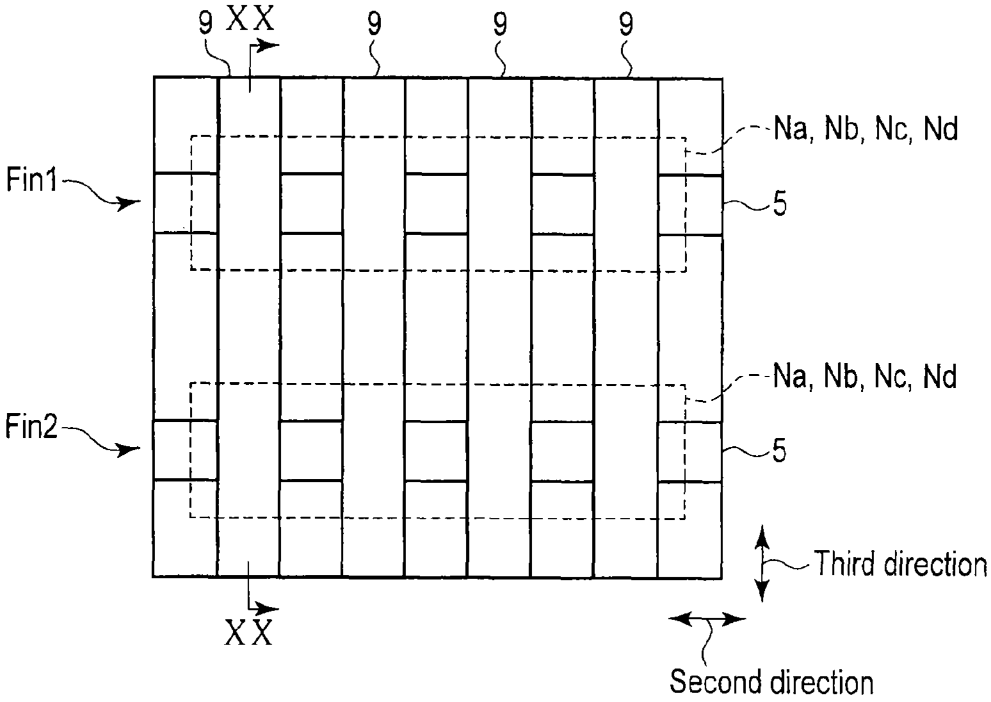
F I G. 19
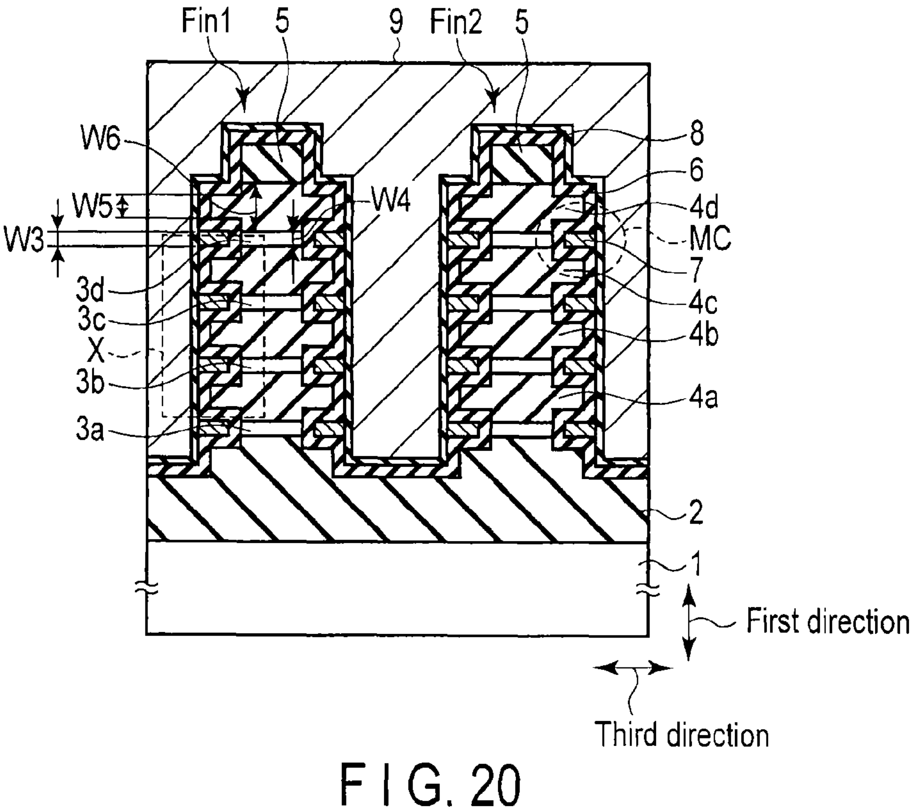
F I G. 20

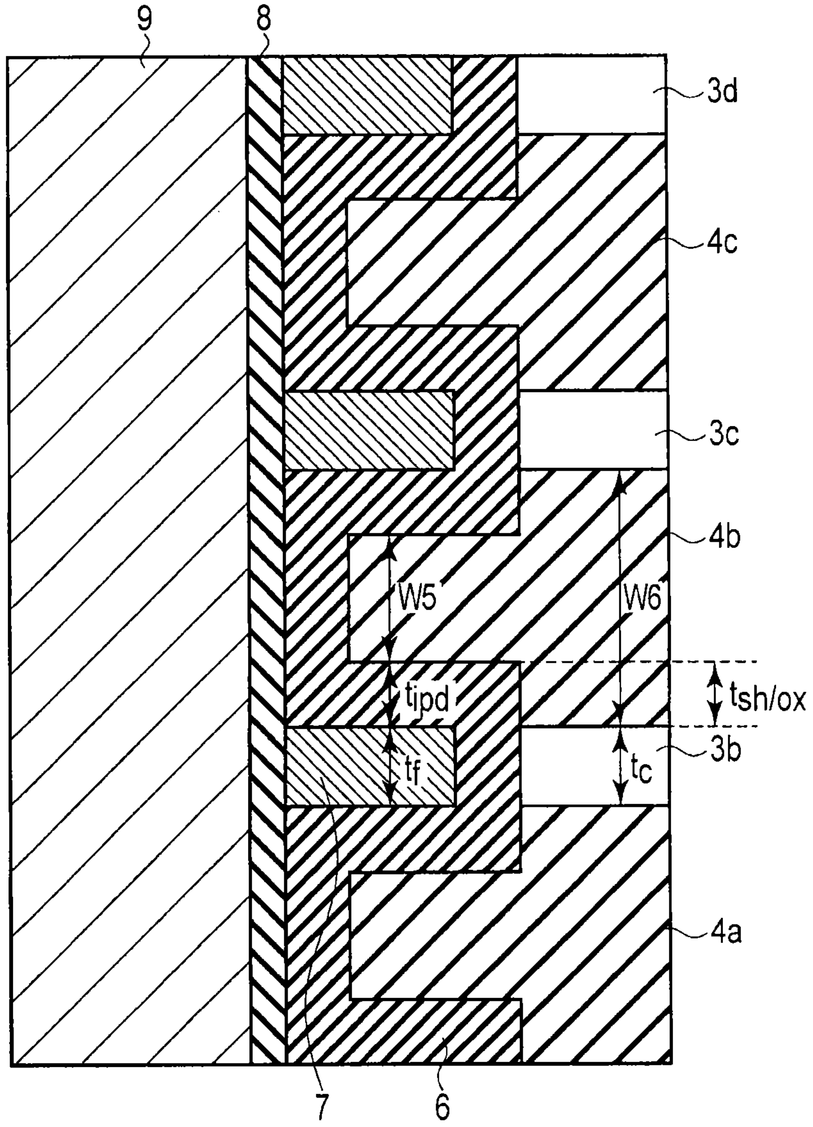
F I G. 21

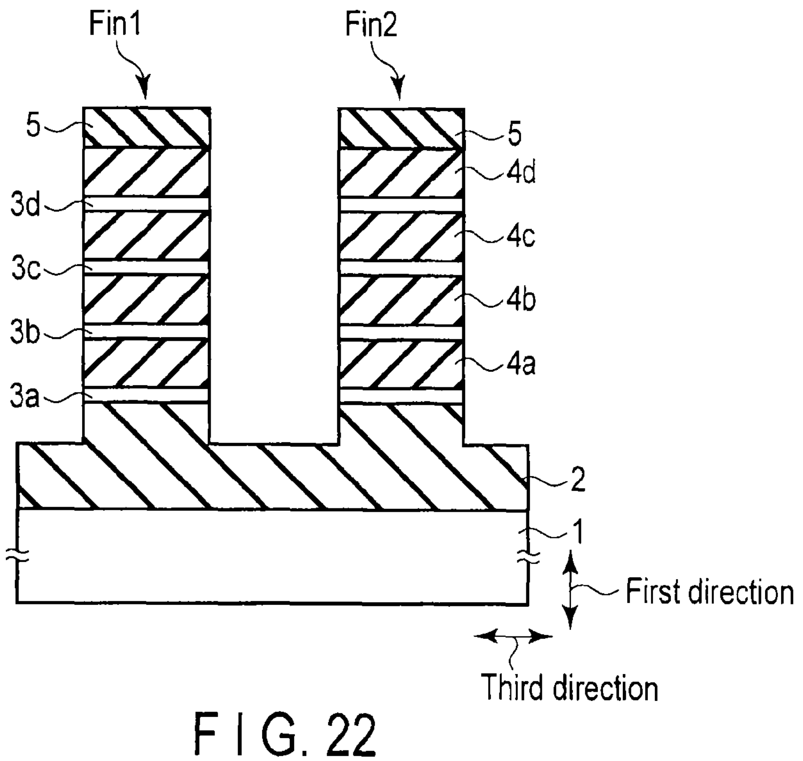
F I G. 22
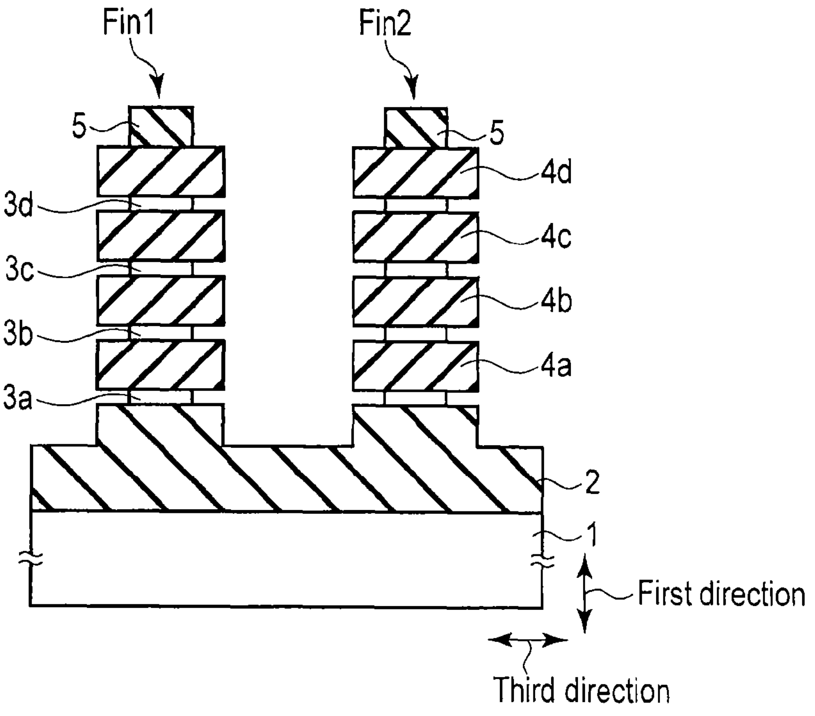
F I G. 23

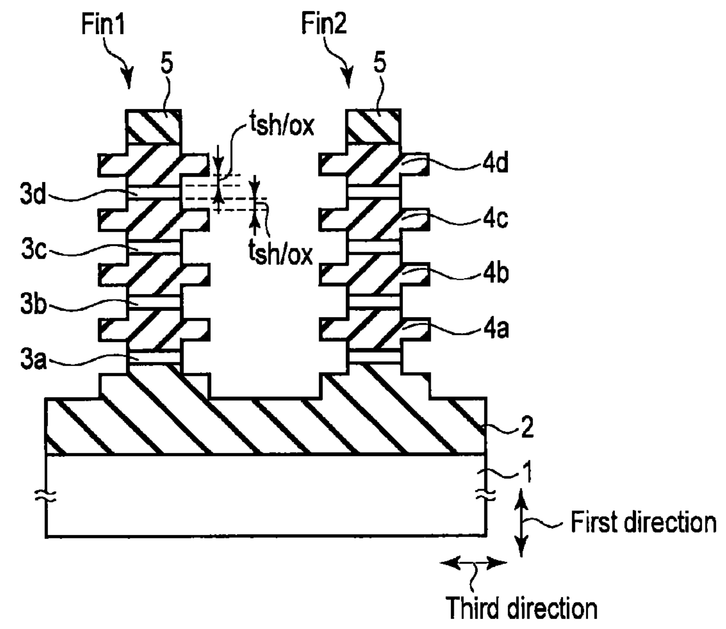
F I G. 24
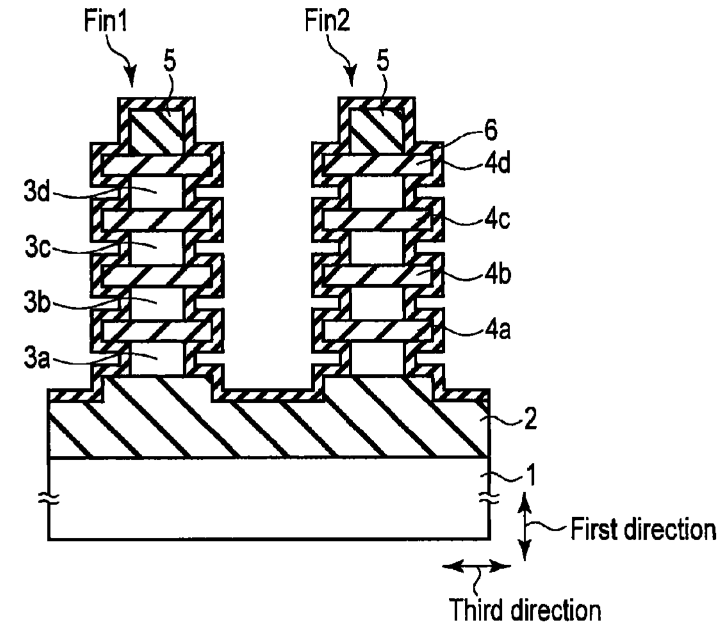
F I G. 25

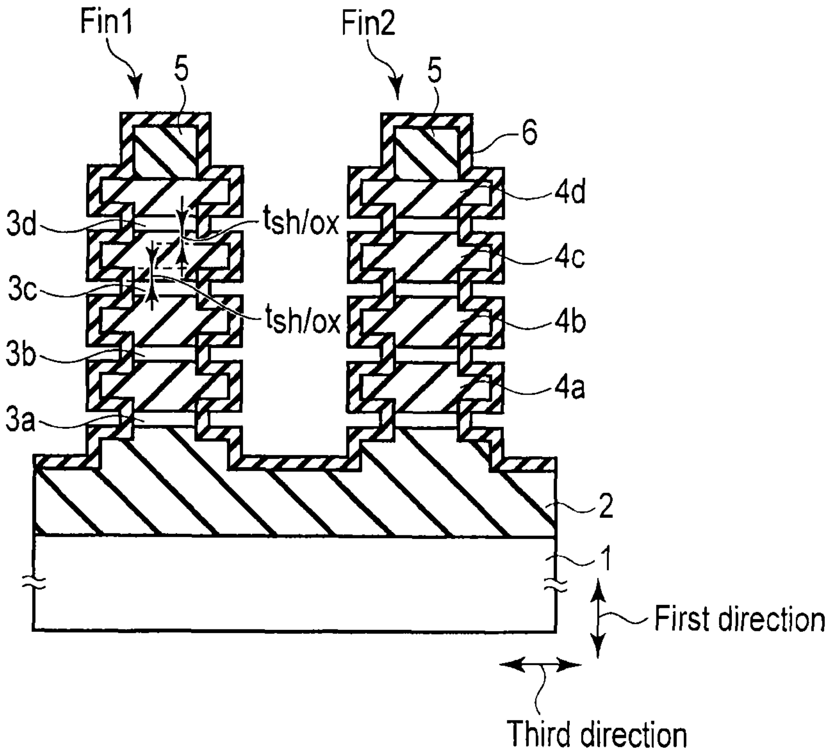
F I G. 26

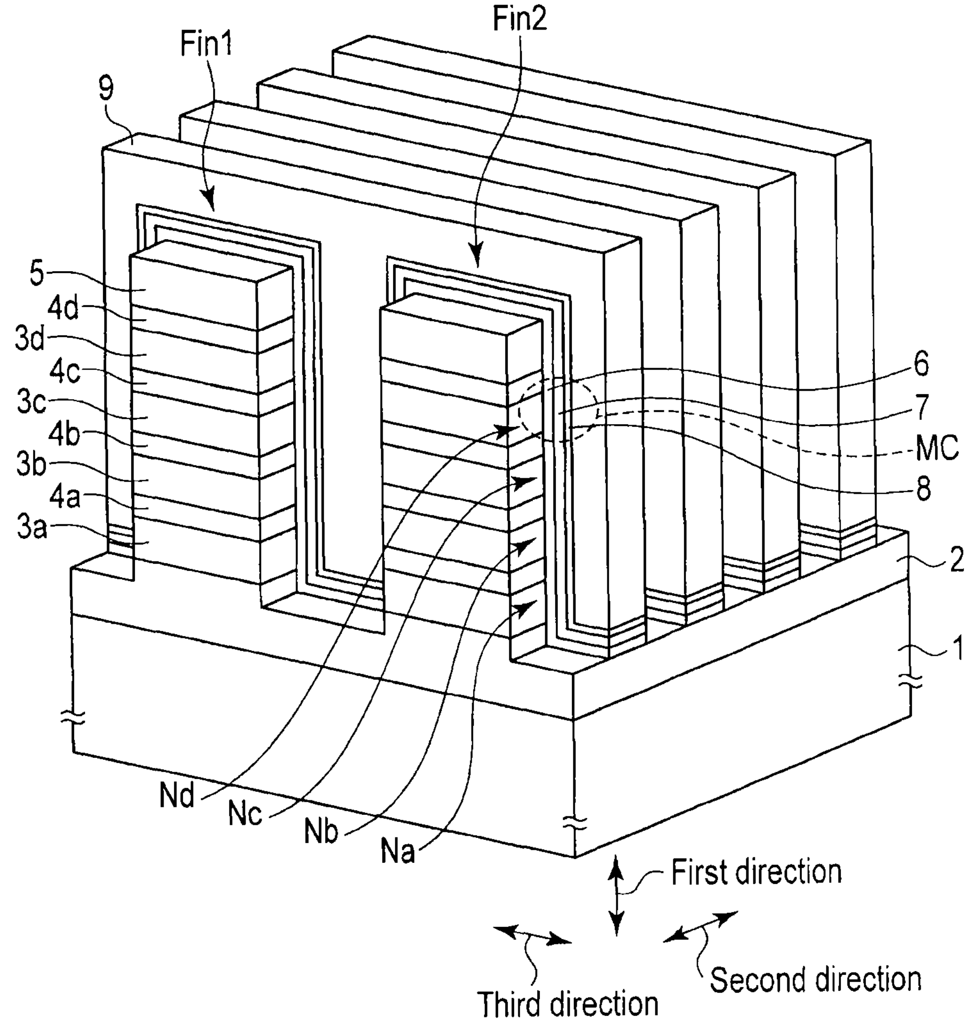
F I G. 27

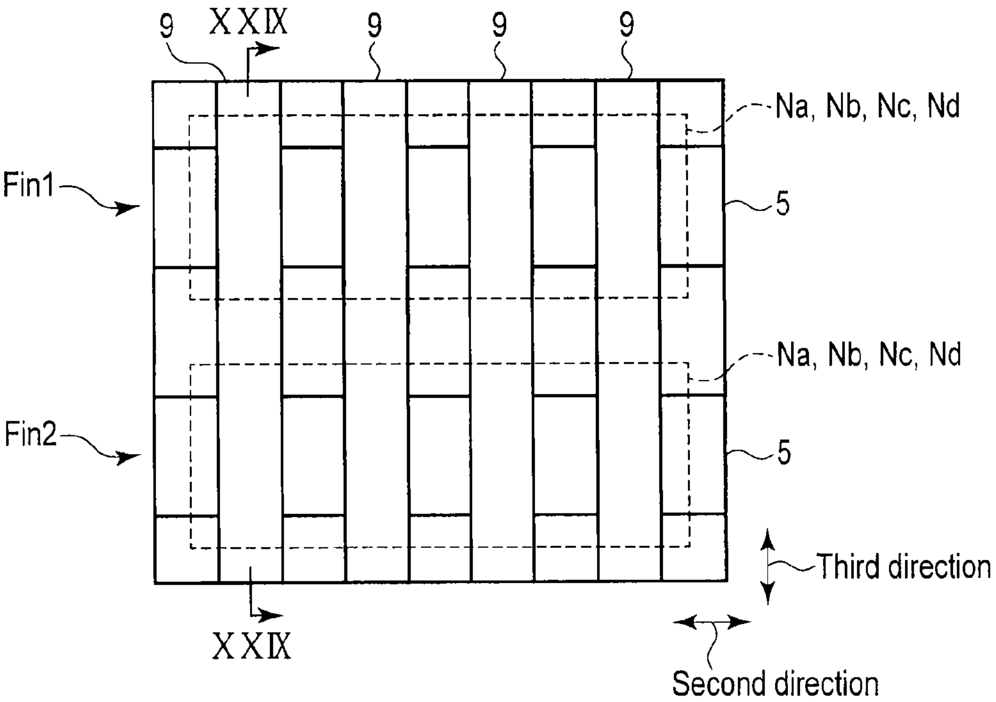
F I G. 28
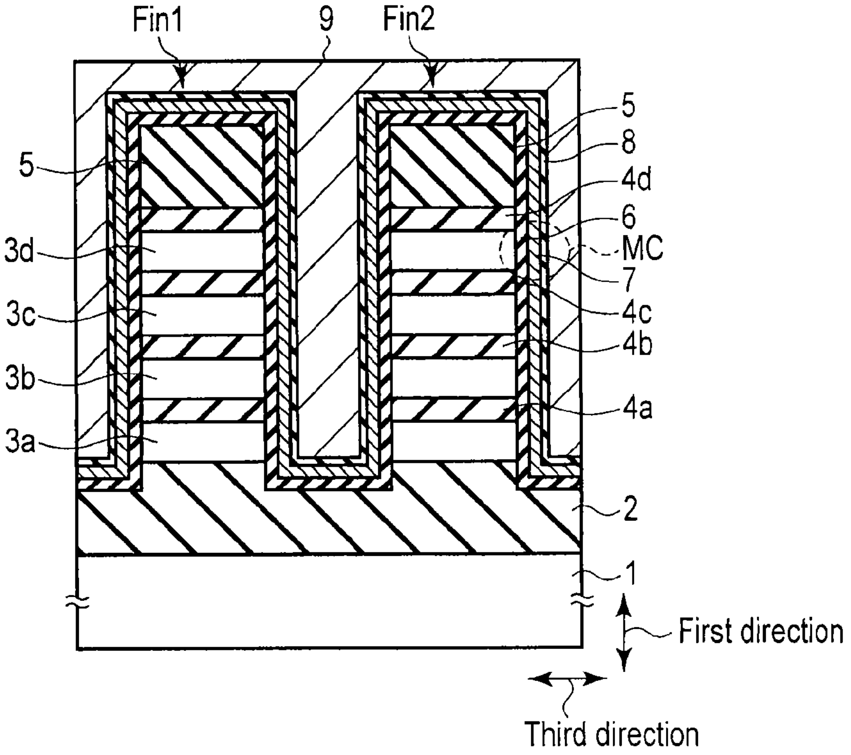
F I G. 29

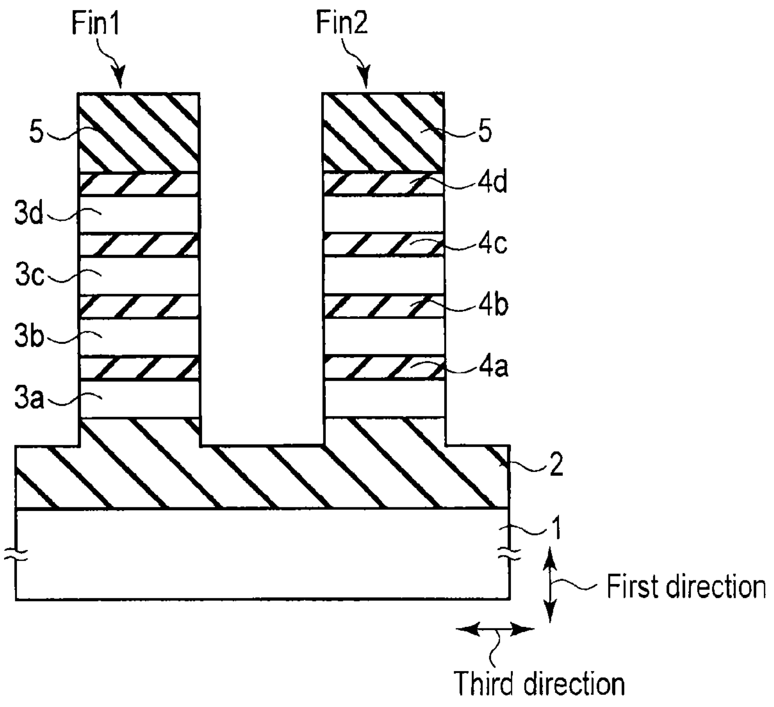
F I G. 30
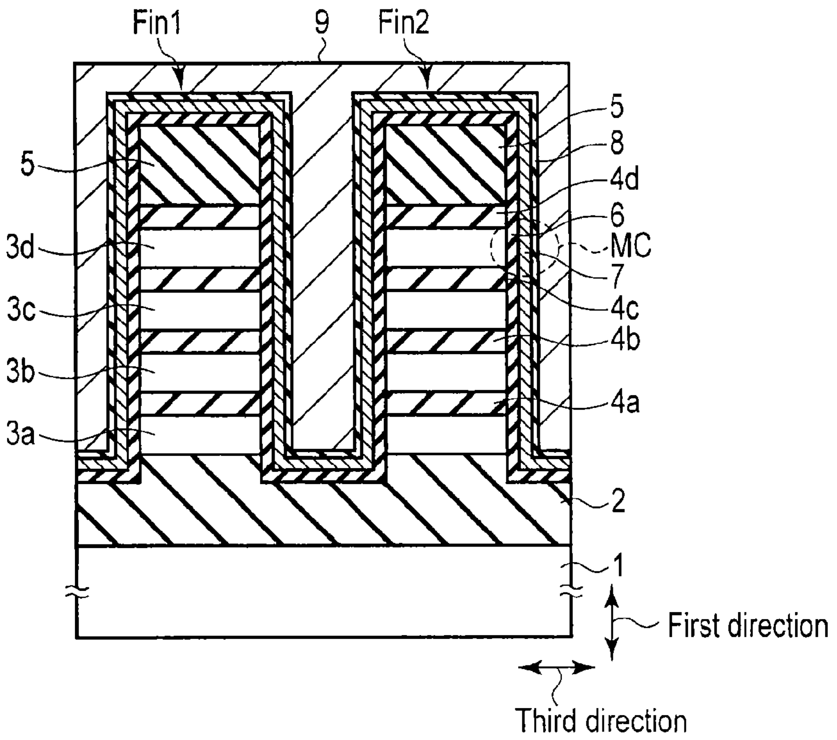
F I G. 31

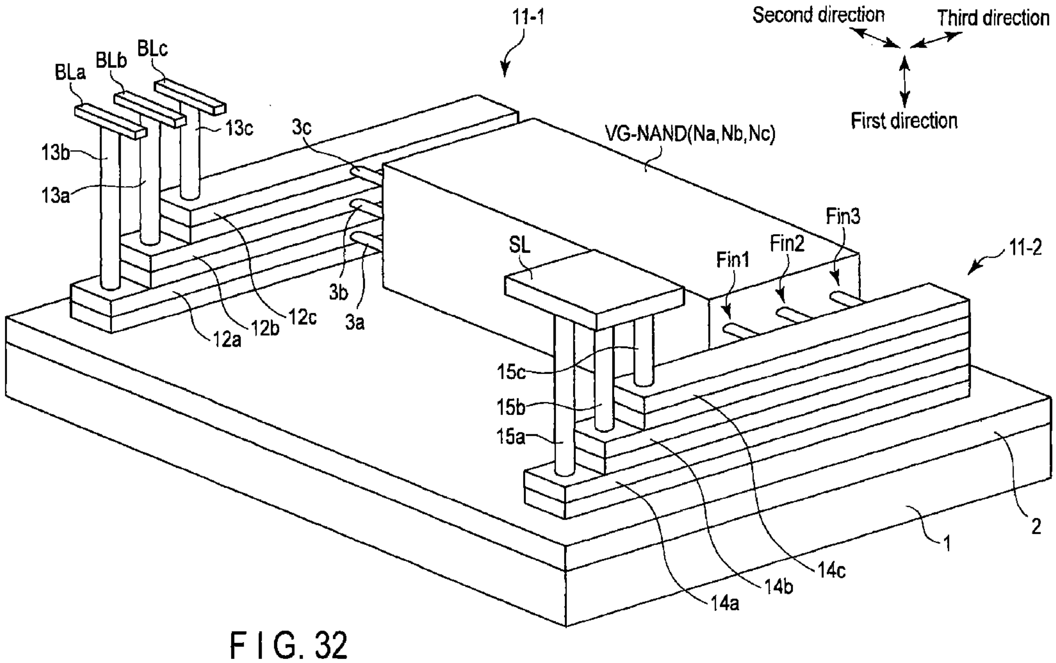
F I G. 32

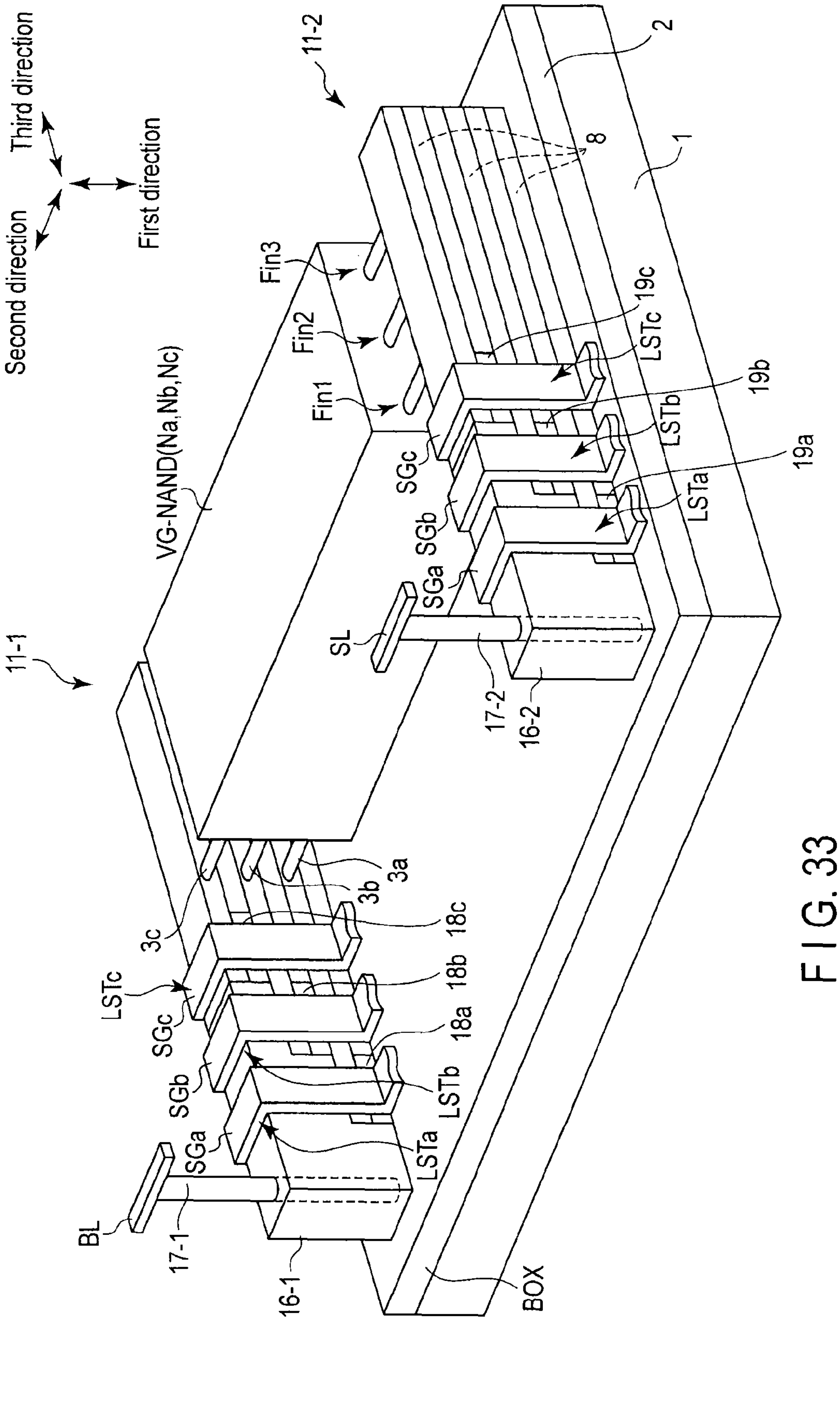
F I G. 33

NONVOLATILE SEMICONDUCTOR MEMORY DEVICE

CROSS-REFERENCE TO RELATED APPLICATIONS

This application is based upon and claims the benefit of priority from Japanese Patent Application No. 2014-041659, filed Mar. 4, 2014, the entire contents of which are incorporated herein by reference.

FIELD

Embodiments described herein relate generally to a nonvolatile semiconductor memory device.

BACKGROUND

NAND flash memories are used widely as mass storage. In recent years, memory devices have been miniaturized for reducing cost-per-bit and increasing volume-per-bit, and further miniaturization is greatly demanded in this technical field. However, before promoting miniaturization of flash memories, there are many issues to be solved such as the development of lithography techniques and inhibition of the short channel effect, interdevice interference, and interdevice variations. Thus, a miniaturization technique simply directed to improvement of a planar structure will not be enough to sustainably increase storage density of memory devices in future.

Considering the above, techniques to shift such a conventional two-dimensional (planar) structure to a three-dimensional (solid) structure have been developed in recent years for higher memory cell integration, and various kinds of three-dimensional nonvolatile semiconductor storage devices have been proposed. One of them is a vertical gate (VG) semiconductor memory structure which has a layout substantially similar to a two-dimensional NAND layout including peripheral devices and the like, and contacts corresponding to the semiconductor layers and gate contacts can be formed therein at the same time.

The VG semiconductor memory structure can be classified broadly into two types by its memory cell structure. One is a vertical gate-floating gate (VG-FG) type in which charge storage layers are electrically floating, and the other is a vertical gate-metal/oxide/nitride/oxide/silicon (VG-MONOS) type in which charge storage layers trap the charge.

Both types feature a gate stacked layer structure (memory cell) in which a tunnel insulating layer, a charge storage layer, a block insulating layer (IPD layer), and a control gate electrode are stacked in this order on a side surface of a semiconductor layer (channel) on a semiconductor substrate.

In such a VG semiconductor memory structure, writing and erasing of data are performed by a charge transfer between the semiconductor layer as a channel and the floating gate electrode. However, when write/erase operations are repeated, the tunnel insulating layer is damaged (defective), and charge is trapped in the damaged part. The charge trapped inside the tunnel insulating layer varies threshold voltage in the memory cell in a read process. Furthermore, when the charge is detrapped, channel current is varied thereby. These phenomena cause a read error.

BRIEF DESCRIPTION OF THE DRAWINGS

FIG. 1 is a perspective view showing a structural example of a first embodiment;

FIG. 2 is a plane view version of FIG. 1;

FIG. 3 is a cross-sectional view taken along line in FIG. 2;

FIG. 4 is a cross-sectional view showing a write/erase operation using the structure of FIGS. 1 to 3;

FIG. 5 is a cross-sectional view showing a read process using the structure of FIGS. 1 to 3;

FIGS. 6 to 12 are cross-sectional views showing an example of a manufacturing method;

FIG. 13 is a perspective view showing a structural example of a second embodiment;

FIG. 14 is a plane view version of FIG. 13; FIG. 15 is a cross-sectional view taken along line XV-XV in FIG. 14;

FIGS. 16 and 17 are cross-sectional views showing an example of a manufacturing method;

FIG. 18 is a perspective view showing a structural example of a third embodiment;

FIG. 19 is a plane view version of FIG. 18; FIG. 20 is a cross-sectional view taken along line XX-XX in FIG. 19;

FIG. 21 is a cross-sectional view showing region X in FIG. 20 in detail;

FIGS. 22 to 26 are cross-sectional views showing an example of a manufacturing method;

FIG. 27 is a perspective view showing a structural example of a fourth embodiment;

FIG. 28 is a plane view version of FIG. 27;

FIG. 29 is a cross-sectional view taken along line XXIX-XXIX in FIG. 28;

FIGS. 30 and 31 are cross-sectional views showing an example of a manufacturing method;

FIG. 32 is a perspective view showing a VG semiconductor memory structure as an application example; and FIG. 33 is a perspective view showing a VG semiconductor memory structure as another application example.

DETAILED DESCRIPTION

In general, according to one embodiment, a nonvolatile semiconductor memory device comprises: a semiconductor substrate; a first stacked layer structure including first to $n^{th}$ semiconductor layers (n is a natural number greater than or equal to 2) stacked in a first direction perpendicular to a surface of the semiconductor substrate, and extending in a second direction parallel to the surface of the semiconductor substrate; and first to $n^{th}$ memory cells provided on surfaces of the first to nth semiconductor layers facing a third direction perpendicular to the first and second directions respectively. The $in^{th}$ memory cell ($1 \le i \le n$) comprises a second stacked layer structure in which a first insulating layer, a charge storage layer, a second insulating layer, and a control gate electrode are stacked on the surface of the $i^{th}$ semiconductor layer facing the third direction. The second insulating layer has an equivalent oxide thickness smaller than that of the first insulating layer.

Hereinafter, embodiments are described with reference to the drawings.

1. First Embodiment (1) Structure

FIG. 1 is a perspective view showing a nonvolatile semiconductor memory device. FIG. 2 is a plane view version of FIG. 1. FIG. 3 is a cross-sectional view taken along line III-III in FIG. 2.

Semiconductor substrate 1 is, for example, a silicon substrate. Base insulating layer 2 is, for example, a silicon oxide layer and is disposed on semiconductor substrate 1.

Fin-type stacked layer structures Fin 1 and Fin 2 are disposed on base insulating layer 2. Each of fin-type stacked layer structures Fin 1 and Fin 2 has, for example, active area layers 3*a*, 3*b*, 3*c*, and 3*d* stacked in a first direction which is perpendicular to the surface of semiconductor substrate 1 (although four active area layers are adopted in this embodiment, the number thereof is variable as long as it is two or more). Furthermore, fin-type stacked layer structures Fin 1 and Fin 2 extend in a second direction which is parallel to the surface of semiconductor substrate 1 and align in a third direction crossing both the first and second directions.

Active area layers 3*a*, 3*b*, 3*c*, and 3*d* are, for example, semiconductor layers. Active area layers 3*a*, 3*b*, 3*c*, and 3*d* should preferably be monocrystalline, but they are not limited thereto and may be amorphous or polycrystalline.

Active area layers 3*a*, 3*b*, 3*c*, and 3*d* are insulated from one another by, for example, interlayer insulating layers 4*a*, 4*b*, 4*c*, and 4*d*. As long as active area layers 3*a*, 3*b*, 3*c*, and 3*d* are insulated from one another, how to insulate the layers is optional and, for example, active area layers 3*a*, 3*b*, 3*c*, and 3*d* may be insulated by cavities formed therebetween.

In the present embodiment, four active area layers 3*a*, 3*b*, 3*c*, and 3*d* are stacked on each other; however, the number of active area layers in fin-type stacked layer structures Fin 1 and Fin 2 is not limited thereto. Since the memory volume of the nonvolatile semiconductor memory device increases as the number of stacked active area layers increases, the larger is preferable.

Memory cell MC is disposed on the side surface of active area layers 3*a*, 3*b*, 3*c*, and 3*d* along the third direction. Memory strings Na, Nb, Nc, and Nd are disposed on active are layers 3*a*, 3*b*, 3*c*, and 3*d*. Each of memory strings Na, Nb, Nc, and Nd includes memory cells MC connected in series in the second direction.

Memory strings Na, Nb, Nc, and Nd may include two select transistors which are connected to two ends of memory cells MC, respectively.

Memory cell MC includes, for example, a gate stacked layer structure disposed on the side surface of active area layers 3*a*, 3*b*, 3*c*, and 3*d* along the third direction. In the gate stacked layer structure, a block insulating layer (IPD layer) 6, charge storage layer (floating gate electrode) 7, tunnel insulating layer 8, and control gate electrode (word line) 9 are stacked in this order.

Here, block insulating layer 6 is an insulating layer which blocks the charge transfer between active area layers 3*a*, 3*b*, 3*c*, and 3*d* and charge storage layer 7 during the write/erase operation. In the present embodiment, block insulating layer 6 functions as a gate insulating layer since it contacts active area layers 3*a*, 3*b*, 3*c*, and 3*d* used as channels.

Furthermore, tunnel insulating layer 8 is an insulating layer which performs the charge transfer by FN tunneling phenomenon between charge storage layer 7 and control electrode 9 during the write/erase operation. Thus, it is essential that an equivalent oxide thickness (EOT) of tunnel insulating layer 8 is smaller than that of block insulating layer 6.

As above, block insulating layer 6 is disposed closer to active area layers 3*a*, 3*b*, 3*c*, and 3*d*. Tunnel insulating layer 8 is disposed closer to control gate electrode 9.

In the present embodiment, the width of active area layers 3*a*, 3*b*, 3*c*, and 3*d* in the third direction is narrower than the width of interlayer insulating layers 4*a*, 4*b*, 4*c*, and 4*d* in the third direction. Consequently, charge storage layer 7 is disposed within recesses between interlayer insulating layers 4*a*, 4*b*, 4*c*, and 4*d* and is separated memory cell MC by memory cell MC in the first direction.

Hard mask layer 5 is disposed on interlayer insulating layer 4*d* which is uppermost layer among the four interlayer insulating layers. Hard mask layer 5 is a mask used in forming fin-type stacked layer structure Fin 1 and Fin 2, and used in separating charge storage layer 7 memory cell MC by memory cell MC in the second direction.

For example, when charge storage layer 7 is separated memory cell MC by memory cell MC in the second direction, width W1 of hard mask layer 5 along the third direction is set narrower than W2 which is the sum of the width of active area layers 3*a*, 3*b*, 3*c*, and 3*d* along the third direction and the double of the width of block insulating layer 6 along the third direction. With this width setting, when control gate electrode 9 is patterned into lines and spaces, charge storage layer 7 is also separated.

Control gate electrode 9 fills a space between fin-type stacked layer structures Fin 1 and Fin 2. Note that, as long as control gate electrode 9 is formed to cover tunnel insulating layer 8, the space between fin-type stacked layer structures Fin 1 and Fin 2 is not necessarily be fully filled.

Control gate electrode 9 extends in the first direction on the side surface of fin-type stacked layer structures Fin 1 and Fin 2 along the third direction and is shared with memory cells MC aligned in the first direction. Furthermore, control gate electrode 9 extends in the third direction when being viewed from above fin-type stacked layer structure Fin 1 and Fin 2.

(2) Materials

Now, materials used for each component of the structure shown in FIGS. 1 to 3 are explained.

Materials used for the above nonvolatile semiconductor memory device may be selected arbitrarily from those suitable for respective generations of semiconductor memories. Prime examples of the materials used are as follows.

Active area layers 3*a*, 3*b*, 3*c*, and 3*d* are, for example, silicon layers. The silicon layers should preferably be monocrystalline, but they are not limited thereto and may be polycrystalline or amorphous. Active area layers 3*a*, 3*b*, 3*c*, and 3*d* may be semiconductor layers such as Ge or compound semiconductor layers such as SiGe.

Base insulating layer 2 and interlayer insulating layers 4*a*, 4*b*, 4*c*, and 4*d* are, for example, silicon oxide layers. Interlayer insulating layers 4*a*, 4*b*, 4*c*, and 4*d* may be a layered structure composed of, for example, silicon oxide layers and silicon nitride layers.

Hard mask layer 5 is an insulating layer formed of a material different from that of interlayer insulating layers 4*a*, 4*b*, 4*c*, and 4*d*, and is, for example, an aluminum nitride layer.

Block insulating layer 6 and tunnel insulating layer 8 are, for example, silicon oxide layers or silicon nitride layers. Block insulating layer 6 and tunnel insulating layer 8 may be silicon oxynitride layers, or a combination of a silicon oxide layer and a silicon nitride layer instead.

Block insulating layer 6 and tunnel insulating layer 8 may be layers of hafnium oxide ($HfO_2$), aluminum oxide ($Al_2O_3$), lanthanum aluminate ($LaAlO_3$), and lanthanum almisilicate oxide (LaAlSiO), or may be layers of these materials with modified composite ratio.

Block insulating layer 6 and tunnel insulating layer 8 may contain silicon nano-particles and metal ions.

Charge storage layer 7 and control gate electrode 9 generally contain a conductive silicon layer or the like. However, the content thereof may vary and the charge storage layer 7 and control gate electrode 9 may contain any material suitable for respective generations of semiconductor memories as long as it can be processed.

That is, charge storage layer 7 and control gate electrode 9 may be formed of a metal compound such as tantalum nitride (TaN), tantalum carbide (TaC), and titanium nitride (TiN), or of an element showing metallic electroconductivity such as Ni, V, Cr, Mn, Y, Mo, Ru, Rh, Hf, Ta, W, Ir, Co, Ti, Er, Pt, Pd, Zr, Gd, Dy, Ho, and Er, or of a silicide of such elements.

(3) Writing/Erasing and Reading

The first embodiment features the charge transfer between charge storage layer 7 and control gate electrode 9 during the write/erase operation. Thus, the equivalent oxide thickness (EOT) of tunnel insulating layer 8 which contacts control gate electrode 9 is smaller than that of block insulating layer 6 which contacts active area layers 3*a*, 3*b*, 3*c*, and 3*d*.

FIG. 4 shows how the write/erase operation is performed.

In the write/erase operation, for example, voltage V1 is applied to active area layer 3*d* and voltage V2 is applied to control gate electrode 9, and consequently, the charge transfer (Ie) is performed between charge storage layer 7 and control gate electrode 9 through tunnel insulating layer 8.

When V1>V2, electrons from control gate electrode 9 are injected into charge storage layer 7 through tunnel insulating layer 8. Here, since the equivalent oxide thickness (EOT) of block insulating layer 6 is larger than that of tunnel insulating layer 8, the charge transfer between active area layer 3*d* and charge storage layer 7 is blocked.

When V1<V2, electrons are discharged from charge storage layer 7 into control gate electrode 9 through tunnel insulating layer 8. At that time, since the equivalent oxide thickness (EOT) of block insulating layer 6 is larger than that of tunnel insulating layer 8, the charge transfer between active area layer 3*d* and charge storage layer 7 is blocked.

FIG. 5 shows how the read process is performed.

In the read process, for example, voltage Vread is applied to control gate electrode 9, and consequently, read current Ir corresponding to data of memory cells (charge in charge storage layer 7) is supplied to active area layer (channel) 3*d*. The read process is performed by detecting read current Ir by a sense amplifier.

Even when tunnel insulating layer 8 is damaged (defective) due to repeated write/erase operations, the present embodiment can provide the two below-mentioned advantages as compared with conventional techniques.

The first advantage is that, even if charge is trapped in a defective part of tunnel insulating layer 8, an adverse influence caused by the trapped charge to threshold voltage of memory cells can be reduced since tunnel insulating layer 8 is distant from active area layers 3*a*, 3*b*, 3*c*, and 3*d* used as channels.

The second advantage is that, even if charge is detrapped from tunnel insulating layer 8, the charge is discharged to control gate electrode 9 and has no influence to channel current flowing in active area layers 3*a*, 3*b*, 3*c*, and 3*d*.

Thus, a read error can be prevented and the nonvolatile semiconductor memory device can have improved reliability.

Now, the first advantage will be considered.

For example, charge ΔQ of the electrons trapped by tunnel insulating layer 8 influences the threshold value of memory cells which is, by Coulomb's law, equivalent to ΔV thus:

$$\Delta Q=C\Delta V, \quad (1)$$

where, C is capacitance.

Equation 1 can be rewritten as:

$$\Delta V=\Delta Q/C. \quad (2)$$

Then, substituting C=ϵS/d in equation 2 gives $$\Delta V=(\Delta Q\times d)/ES. \quad (3)$$

Equation 3 means that the influence ΔV on the threshold voltage of memory cells is proportional to distance d which is a distance between the electron trapped by the tunnel insulating layer 8 and active area layers 3*a*, 3*b*, 3*c*, and 3*d* used as channels. Here, ϵ is permittivity of an insulator between the electron trapped by tunnel insulating layer 8 and active area layers 3*a*, 3*b*, 3*c*, and 3*d* used as channels.

From the above consideration, it is understood that the influence of the trapped electron to the threshold voltage of memory cells can be reduced when the position of the trapped electron is distant from active area layers 3*a*, 3*b*, 3*c*, and 3*d* used as channels.

(4) Manufacturing Method

Now, an example of manufacturing method of the structure in FIGS. 1 to 3 is explained.

Initially, as shown in FIG. 6, a first conductive (p-type, for example) semiconductor substrate (silicon substrate, for example) 1 whose plane orientation is (100) and resistivity is from 10 to 20 Ω-cm is prepared. On semiconductor substrate 1, base insulating layer (silicon oxide layer, for example) 2, interlayer insulating layers (silicon oxide layers) 4*a*, 4*b*, 4*c*, and 4*d*, and active area layers (for example, monocrystalline silicon layers) 3*a*, 3*b*, 3*c*, and 3*d* are formed.

Then, upon interlayer insulating layer 4*d* which is the uppermost layer of the four interlayer insulating layers, hard mask layer (aluminum nitride layer, for example) 5 is formed.

Next, as shown in FIG. 7, the layered structure is etched by anisotropy etching using hard mask layer 5 as a mask, for example. As a result of that, fin-type stacked layer structures Fin 1 and Fin 2 which extend in the second direction and align in the third direction are formed.

Then, as shown in FIG. 8, active area layers 3*a*, 3*b*, 3*c*, and 3*d* and hard mask layer 5 are shrunk selectively by, for example, wet etching. That is, the width of active area layers 3*a*, 3*b*, 3*c*, and 3*d* along the third direction and the width of hard mask layer 5 along the third direction are narrower than the width of interlayer insulating layers 4*a*, 4*b*, 4*c*, and 4*d* along the third direction, respectively.

Next, as shown in FIG. 9, block insulating layer 6 covering fin-type stacked layer structures Fin 1 and Fin 2 is formed by, for example, the CVD method. block insulating layer 6 covers the surfaces of active area layers 3*a*, 3*b*, 3*c*, and 3*d* along the third direction and projections of interlayer insulating layers 4*a*, 4*b*, 4*c* , and 4*d*.

Then, as shown in FIG. 10, a first conductor covering fin-type stacked layer structures Fin 1 and Fin 2 is formed by, for example, the CVD method. Then, the first conductor is shrunk selectively to form the charge storage layers (floating gate electrodes) 7 each including the first conductor. Recesses between interlayer insulating layers 4*a*, 4*b*, 4*c*, and 4*d* are filled with charge storage layers 7.

Then, as shown in FIG. 11, tunnel insulating layer 8 covering fin-type stacked layer structures Fin 1 and Fin 2 are formed by, for example, the CVD method. Tunnel insulating layer 8 has only to cover at least the surface of charge storage layer 7 along the third direction. Thus, tunnel insulating layer 8 may be formed to only cover the surface of charge storage layer 7 along the third direction by, for example, a thermal oxidization method.

Then, as shown in FIG. 12, a second conductor is formed to cover fin-type stacked layer structures Fin 1 and Fin 2 and fill a space therebetween by, for example, the CVD method.

Now, the second conductor is patterned into lines and spaces extending in the third direction by anisotropy etching using, for example, a resist layer as a mask. Consequently, control gate electrode (word line) 9 including the second conductor can be formed.

In this patterning, charge storage layer 7 can be separated at the same time with hard mask layer 5 used as a mask.

Through the above steps, the structure of FIGS. 1 to 3 can be achieved.

(5) Conclusion

As can be understood from the above, the first embodiment disposes block insulating layer 6 at the side of active area layers 3*a*, 3*b*, 3*c*, and 3*d* and disposes tunnel insulating layer 8 at the side of control gate electrode 9, and therefore it can manufacture the nonvolatile semiconductor memory device with improved reliability.

2. Second Embodiment (1) Structure

FIG. 13 is a perspective view showing a nonvolatile semiconductor memory device, and FIG. 14 is a plane view version of FIG. 13. FIG. 15 is a cross-sectional view taken along line XV-XV in FIG. 14.

The second embodiment is a modification example of the first embodiment.

Compared with the first embodiment, the second embodiment has a structural difference in the layout of block insulating layer 6 in memory cell MC.

That is, looking at the first embodiment, block insulating layer 6 covers the ends of interlayer insulating layers 4*a*, 4*b*, 4*c*, and 4*d* along the third direction and is shared by memory cells MC disposed on active area layers (semiconductor layers) 3*a*, 3*b*, 3*c*, and 3*d*. This is evident from FIGS. 1 to 3.

On the other hand, in the second embodiment, block insulating layer 6 is disposed only on the surfaces of active area layers 3*a*, 3*b*, 3*c*, and 3*d* along the third direction, which are within the recesses between interlayer insulating layers 4*a*, 4*b*, 4*c*, and 4*d*. This is shown in FIGS. 13 to 15.

Here, width W3 of charge storage layer 7 along the first direction can be set substantially equal to width W4. This means that a facing area between active area layers 3*a*, 3*b*, 3*c*, and 3*d* and charge storage layer 7 is increased, and thus a coupling ratio of memory cells MC during the write/erase operation can be improved.

Accordingly, the second embodiment can apply a high electric field to tunnel insulating layer 8 during the write/erase operation and increase the charge transfer between charge storage layer 7 and control gate electrode 9. Thus, the write/erase operation can be performed with higher efficiency.

The second embodiment is equal to the first embodiment in the other technical points. Therefore, the elements shown in FIGS. 1 to 3 are referred to by the same reference numbers in FIGS. 13 to 15 and their detailed descriptions are omitted.

(2) Materials

The materials used in the first embodiment are all applicable to materials for the elements of the structure in FIGS. 13 to 15, and thus, descriptions considered redundant are omitted here.

(3) Writing/erasing and reading

The write/erase and read operations in the first embodiment are all applicable to those carried out by the structure in FIGS. 13 to 15, and thus, descriptions considered redundant are omitted here.

(4) Manufacturing method

Now, an example of manufacturing method of the structure in FIGS. 13 to 15 is explained.

Initially, as shown in FIG. 16, active area layers 3*a*, 3*b*, 3*c*, and 3*d* and hard mask layer 5 are shrunk as in the processes carried out in the first embodiment (FIGS. 6 to 8).

Then, as shown in FIG. 17, block insulating layer 6 is formed on the surfaces of active area layers 3*a*, 3*b*, 3*c*, and 3*d* along the third direction.

Block insulating layer 6 should preferably be formed only on the surfaces of active area layers 3*a*, 3*b*, 3*c*, and 3*d* along the third direction by, for example, an oxidation process such as thermal oxidation or plasma oxidation or a nitriding process such as thermal nitriding or plasma nitriding.

Then, the processes carried out in the first embodiment (FIGS. 10 to 12) are carried out similarly, and the structure in FIGS. 13 to 15 is obtained.

(5) Conclusion

As can be understood from the above, the second embodiment can manufacture the nonvolatile semiconductor memory device with improved reliability as in the first embodiment. Furthermore, since the block insulating layer 6 does not narrow the area in which charge storage layer 7 is disposed, the write/erase operation can be performed with higher efficiency.

3. Third embodiment (1) Structure

FIG. 18 is a perspective view showing a nonvolatile semiconductor memory device, and FIG. 14 is a plane view version of FIG. 18. FIG. 20 is a cross-sectional view taken along line XX-XX in FIG. 19.

The third embodiment is a modification example of the first embodiment.

Compared with the first embodiment, the third embodiment has a structural difference in the width of interlayer insulating layers 4*a*, 4*b*, 4*c*, and 4*d*. In the present embodiment, width W5 of the ends of interlayer insulating layers 4*a*, 4*b*, 4*c*, and 4*d* along the first direction is narrower than width W6 of interlayer insulating layers 4*a*, 4*b*, 4*c*, and 4*d* between or on active area layers 3*a*, 3*b*, 3*c*, and 3*d* along the first direction.

That is, looking at the first embodiment, the width of interlayer insulating layers 4*a*, 4*b*, 4*c*, and 4*d* along the first direction remains basically invariant as shown in FIGS. 1 to 3. On the other hand, in the third embodiment, the width of interlayer insulating layers 4*a*, 4*b*, 4*c*, and 4*d* along the first direction varies as being thicker at the central part of fin-type stacked layer structures Fin 1 and Fin 2 and as being narrower at the ends along the third direction as shown in FIGS. 18 to 20.

In that case, even when block insulating layer 6 covers the ends (projections) of interlayer insulating layers 4*a*, 4*b*, 4*c*, and 4*d* along the third direction, width W3 of charge storage layer 7 in the first direction can be substantially the same as width W4 of active area layers 3*a*, 3*b*, 3*c*, and 3*d* along the first direction. Consequently, a facing area between active area layers 3*a*, 3*b*, 3*c*, and 3*d* and charge storage layer 7 can be increased and a coupling ratio of memory cells MC during the write/erase operation can be improved.

Accordingly, the third embodiment can apply a high electric field to tunnel insulating layer 8 during the write/erase operation and increase the charge transfer between charge storage layer 7 and control gate electrode 9. Thus, the write/erase operation can be performed with higher efficiency.

The third embodiment is the same as the first embodiment in the other technical points. Therefore, the elements shown in FIGS. 1 to 3 are referred to by the same reference numbers in FIGS. 18 to 20 and their detailed descriptions are omitted.

(2) Relationship Between the Charge Storage Layer and Active Area Layer

FIG. 21 shows region X of FIG. 20 in detail.

When block insulating layer 6 is disposed close to active area layers 3*a*, 3*b*, 3*c*, and 3*d* while tunnel insulating layer 8 is disposed close to control gate electrode 9, block insulating layer 6 must be formed within the recesses of interlayer insulating layers 4*a*, 4*b*, 4*c*, and 4*d*.

However, block insulating layer 6 is generally thicker than tunnel insulating layer 8. Furthermore, when a high dielectric substance (high-k insulating layer) is used for block insulating layer 6, physical thickness thereof increases more. Thus, the structure of the third embodiment is very effective in order to enlarge the area in which charge storage layer 7 is disposed and to widen the width of charge storage layer 7 along the first direction.

Here, explained is a desirable relationship between the width of charge storage layer 7 along the first direction and the width of active area layers 3*a*, 3*b*, 3*c*, and 3*d* in a case where the third embodiment is adopted.

Firstly, width W5 of the ends of interlayer insulating layers 4*a*, 4*b*, 4*c*, and 4*d* along the first direction should preferably be, for example, 1 nm or more in order to insulate charge storage layers (floating gate electrodes) 7 from each other.

Thus, it is required that W5>0, or preferably, W5≥1 nm.

The value $t_{sh/ox}$ refers to the thickness of interlayer insulating layers 4*a*, 4*b*, 4*c*, and 4*d* formed by the shrink process or the thickness of active area layers 3*a*, 3*b*, 3*c*, and 3*d* formed by the oxidation process.

Now, provided that the width of interlayer insulating layers 4*a*, 4*b*, 4*c*, and 4*d* between or on active area layers 3*a*, 3*b*, 3*c*, and 3*d* along the first direction is width W6, if $t_{sh/ox}$ corresponds to the shrinkage of interlayer insulating layers 4*a*, 4*b*, 4*c*, and 4*d*, $W5=W6-2\times t_{sh/ox}$ (shrinkage). Or, if $t_{sh/ox}$ corresponds to the degree of oxidation, $W6=W5+2\times t_{sh/ox}$ (degree of oxidation).

Now, considering the write/erase operation, width tf of charge storage layer 7 along the first direction must be less than or equal to width tc of active area layers 3*a*, 3*b*, 3*c*, and 3*d* along the first direction in order to improve the coupling ratio of memory cells MC.

$$\text{That is, } tf \le tc. \tag{1}$$

This is because tf>tc means that a facing area between active area layers 3*a*, 3*b*, 3*c*, and 3*d* and charge storage layer 7 is smaller than that between charge storage layer 7 and control gate electrode 9, and the coupling ratio decreases.

Furthermore, the volume of charge storage layer 7 should preferably be as large as possible in order to store more charge within the layer. Thus, a condition that the volume of charge storage layer 7 is maximally enlarged while keeping tf≤tc is given by $$tf=tc. \tag{2}$$

That is, width tf of charge storage layer 7 along the first direction should preferably be substantially the same as width tc of active area layers 3*a*, 3*b*, 3*c*, and 3*d* along the first direction.

Here, given that the width of block insulating layer 6 along the first direction between charge storage layer 7 and interlayer insulating layers 4*a*, 4*b*, 4*c*, and 4*d* is $t_{ipd}$, the condition 1 is satisfied when $$t_{sh/ox} \le t_{ipd}. \tag{3}$$

Furthermore, equation 2 is satisfied when $$t_{sh/ox} = t_{ipd}. \tag{4}$$

Therefore, to achieve the most desirable relationship between the charge storage layer and active area layers, that is, to satisfy equation 2, the nonvolatile semiconductor memory device in FIGS. 18 to 20 must be manufactured to satisfy equation 4.

(3) Materials

The materials used in the first embodiment are all applicable to materials for the elements of the structure in FIGS. 18 to 20, and thus, descriptions considered redundant are omitted here.

(4) Writing/erasing and reading

The write/erase and read operations in the first embodiment are all applicable to those in the structure in FIGS. 18 to 20, and thus, descriptions considered redundant are omitted here.

(5) Manufacturing method

Now, an example of manufacturing method of the structure in FIGS. 18 to 20 is explained. Initially, as shown in FIG. 22, a first conductive (p-type, for example) semiconductor substrate (silicon substrate, for example) 1 whose plane orientation is (100) and resistivity is from 10 to 20 Ω-cm is prepared. On the semiconductor substrate 1, base insulating layer (silicon oxide layer, for example) 2, interlayer insulating layers (silicon oxide layers) 4*a*, 4*b*, 4*c*, and 4*d*, and active area layers (for example, monocrystalline silicon layers) 3*a*, 3*b*, 3*c*, and 3*d* are formed.

Compared with the manufacturing method in the first embodiment, the thickness of interlayer insulating layers 4*a*, 4*b*, 4*c*, and 4*d* (width along the first direction) is thicker, and the thickness of active area layers 3*a*, 3*b*, 3*c*, and 3*d* (width along the first direction) is thinner in the present embodiment. Thinner active area layers 3*a*, 3*b*, 3*c*, and 3*d* are advantageous in the miniaturization of memory cells MC.

Then, hard mask layer (aluminum nitride layer, for example) 5 is formed on interlayer insulating layer 4*d* which is the uppermost layer among the four interlayer insulating layers.

Next, the layered structure is etched by anisotropy etching using hard mask layer 5 as a mask, for example. As a result of that, fin-type stacked layer structures Fin 1 and Fin 2 which extend in the second direction and align in the third direction are formed.

Then, as shown in FIG. 23, active area layers 3*a*, 3*b*, 3*c*, and 3*d* and hard mask layer 5 are shrunk selectively by, for example, wet etching. That is, the width of active area layers 3*a*, 3*b*, 3*c*, and 3*d* along the third direction and the width of hard mask layer 5 along the third direction are narrower than the width of interlayer insulating layers 4*a*, 4*b*, 4*c*, and 4*d* along the third direction, respectively.

Next, as shown in FIG. 24, interlayer insulating layers 4*a*, 4*b*, 4*c*, and 4*d* are shrunk selectively by, for example, wet etching. That is, at the ends (projections) of interlayer insulating layers 4*a*, 4*b*, 4*c*, and 4*d* along the third direction, the width of interlayer insulating layers 4*a*, 4*b*, 4*c*, and 4*d* along the first direction is narrower than the width of interlayer insulating layers 4*a*, 4*b*, 4*c*, and 4*d* between or on active area layers 3*a*, 3*b*, 3*c*, and 3*d* along the first direction by $2\times t_{sh/ox}$.

With this step, the area in which the charge storage layer of the memory cell is disposed, that is, the width of the recesses between interlayer insulating layers 4*a*, 4*b*, 4*c*, and 4*d* along the first direction can be widened.

Then, the processes carried out in the first embodiment (FIGS. 9 to 12) are carried out similarly, and the structure of FIGS. 18 to 20 can be obtained.

Or, the structure of FIGS. 18 to 20 may be obtained by the following manufacturing method.

Firstly, as shown in FIG. 25, active area layers 3*a*, 3*b*, 3*c*, and 3*d* and hard mask layer 5 are shrunk and block insulating layer 6 is formed to cover fin-type stacked layer structures Fin 1 and Fin 2 similarly to the processes carried out in the first embodiment (FIGS. 6 to 9).

Then, as shown in FIG. 26, the ends of active area layers 3*a*, 3*b*, 3*c*, and 3*d* along the first direction, that is, the parts of active area layers 3*a*, 3*b*, 3*c*, and 3*d* which contact interlayer insulating layers 4*a*, 4*b*, 4*c*, and 4*d* are oxidized by annealing in an oxygen atmosphere. Here, interlayer insulating layers 4*a*, 4*b*, 4*c*, and 4*d* are insulating layers containing oxygen (for example, silicon oxide layers).

By this step, the thickness of active area layers 3*a*, 3*b*, 3*c*, and 3*d*, that is, the width along the first direction can be narrowed by $2\times t_{sh/ox}$.

Then, the processes carried out in the first embodiment (FIGS. 10 to 12) are carried out similarly, and the structure in FIGS. 18 to 20 is obtained.

(6) Conclusion

As can be understood from the above, the second embodiment can manufacture the nonvolatile semiconductor memory device with improved reliability as in the first embodiment. Furthermore, even when block insulating layer 6 covers the projections between interlayer insulating layers 4*a*, 4*b*, 4*c*, and 4*d*, the width of charge storage layer 7 along the first direction can be substantially the same as the width of active area layers 3*a*, 3*b*, 3*c*, and 3*d* along the first direction, and thus, the write/erase operation can be performed with higher efficiency. Furthermore, thinner active area layers 3*a*, 3*b*, 3*c*, and 3*d* are advantageous in the miniaturization of memory cells MC.

4. Fourth Embodiment (1) Structure

FIG. 27 is a perspective view showing a nonvolatile semiconductor memory device, and FIG. 28 is a plane view version of FIG. 27. FIG. 29 is a cross-sectional view taken along line XXIX-XXIX in FIG. 28.

Comparing the fourth embodiment with the first to third embodiments, the structure of memory cell MC in this embodiment is significantly different from those in the first to third embodiments.

That is, in the first to third embodiments, electrically floating conductive layer (floating gate electrode) is used as charge storage layer 7 in memory cell MC. On the other hand, charge trap insulating layer (charge trap layer) is used as charge storage layer 7 in memory cell MC in the fourth embodiment.

The semiconductor substrate 1 is, for example, a silicon substrate. Base insulating layer 2 is, for example, a silicon oxide layer and is disposed on semiconductor substrate 1.

Fin-type stacked layer structures Fin 1 and Fin 2 are disposed on the base insulating layer 2. Each of fin-type stacked layer structures Fin 1 and Fin 2 has, for example, active area layers 3*a*, 3*b*, 3*c*, and 3*d* stacked in a first direction which is perpendicular to the surface of semiconductor substrate 1 (although four active area layers are adopted in this embodiment, the number thereof is variable as long as it is two or more). Furthermore, fin-type stacked layer structures Fin 1 and Fin 2 extend in a second direction parallel to the surface of semiconductor substrate 1 and align in a third direction crossing both the first and second directions.

Active area layers 3*a*, 3*b*, 3*c*, and 3*d* are, for example, semiconductor layers. Active area layers 3*a*, 3*b*, 3*c*, and 3*d* should preferably be monocrystalline, but they are not limited thereto and may be amorphous or polycrystalline.

Active area layers 3*a*, 3*b*, 3*c*, and 3*d* are insulated from one another by, for example, interlayer insulating layers 4*a*, 4*b*, 4*c*, and 4*d*. As long as active area layers 3*a*, 3*b*, 3*c*, and 3*d* are insulated from one another, how to insulate the layers is optional and, for example, active area layers 3*a*, 3*b*, 3*c*, and 3*d* may be insulated by cavities formed therebetween.

In the present embodiment, four active area layers 3*a*, 3*b*, 3*c*, and 3*d* are stacked on each other; however, the number of active area layers in fin-type stacked layer structures Fin 1 and Fin 2 is not limited thereto. Since the memory volume of the nonvolatile semiconductor memory device increases as the number of stacked active area layers increases, the larger is preferable.

Memory cell MC is disposed on the side surface of active area layers 3*a*, 3*b*, 3*c*, and 3*d* along the third direction. Memory strings Na, Nb, Nc, and Nd are disposed on active are layers 3*a*, 3*b*, 3*c*, and 3*d*. Each of memory strings Na, Nb, Nc, and Nd includes memory cells MC connected in series in the second direction.

Memory strings Na, Nb, Nc, and Nd may include two select transistors which are connected to two ends of memory cells MC, respectively.

Memory cell MC includes, for example, a gate stacked layer structure disposed on the side surface of active area layers 3*a*, 3*b*, 3*c*, and 3*d* in the third direction. In the gate stacked layer structure, block insulating layer 6, charge storage layer (charge trap layer) 7, tunnel insulating layer 8, and control gate electrode (word line) 9 are stacked in this order.

As above, block insulating layer 6 is disposed closer to active area layers 3*a*, 3*b*, 3*c*, and 3*d* and tunnel insulating layer 8 is disposed closer to control gate electrode 9. This is similar to the first to third embodiments.

In the present embodiment, the width of active area layers 3*a*, 3*b*, 3*c*, and 3*d* along the third direction is substantially the same as the width of interlayer insulating layers 4*a*, 4*b*, 4*c*, and 4*d* along the third direction.

Hard mask layer 5 is disposed on interlayer insulating layer 4*d* which is uppermost among the four interlayer insulating layers. Hard mask layer 5 is a mask used in forming fin-type stacked layer structures Fin 1 and Fin 2.

Control gate electrode 9 fills a space between fin-type stacked layer structures Fin 1 and Fin 2. Note that, the space between fin-type stacked layer structures Fin 1 and Fin 2 is not necessarily be filled by control gate electrode 9.

Control gate electrode 9 extends in the first direction on the side surface of fin-type stacked layer structures Fin 1 and Fin 2 along the third direction and is shared with memory cells MC aligned in the first direction. Furthermore, control gate electrode 9 extends in the third direction when being viewed from above fin-type stacked layer structure Fin 1 and Fin 2.

Here, in the present embodiment, block insulating layer 6, charge storage layer 7, and tunnel insulating layer 8 are disposed immediately below control gate electrode 9 and extend in the first direction on the side surfaces of fin-type stacked layer structures Fin 1 and Fin 2 along the third direction. That is, in the first direction, charge storage layers 7 of memory cells MC are connected to each other.

In the present embodiment, charge storage layer 7 is a charge trap layer. Thus, even if charge storage layers 7 of memory cells MC are connected to each other, there is no problem.

Furthermore, in the present embodiment, memory cells MC, that is, charge storage layers 7 of memory strings Na, Nb, Nc, and Nd are separated from each other in the first direction.

Note that, for the same reason stated above, charge storage layers 7 of memory cells MC may be connected to each other in the first direction. In that case, when control gate electrode 9 is patterned into lines and spaces, charge storage layer 7 should not be patterned.

(2) Materials

Now, materials used for each component of the structure shown in FIGS. 27 to 29 are explained.

Materials used for the above nonvolatile semiconductor memory device may be selected arbitrarily from those suitable for respective generations of semiconductor memories. Prime examples of the materials used are as follows.

Charge storage layer 7 is at least one selected from a group consisting of silicon-rich SiN, SixNy where x and y are optional composite ratio of silicon and nitride, silicon oxynitride (SiON), aluminum oxide ($Al_2O_3$), aluminum oxynitride (AlON), hafnium ($HfO_2$), hafnium aluminate ($HfAlO_3$), hafnium nitride (HfON), hafnium nitride aluminate (HfAlON), hafnium silicate (HfSiO), hafnium nitride silicate (HfSiON), lanthanum oxide ($La_2O_3$), and lanthanum alminate ($LaAlO_3$).

The other structural components can be formed of the same materials used in the first embodiment, and thus, descriptions considered redundant are omitted here.

(3) Writing/Erasing and Reading

The write/erase and read operations in the first embodiment are all applicable to those in the structure in FIGS. 27 to 29, and thus, descriptions considered redundant are omitted here.

(4) Manufacturing Method

Now, an example of the manufacturing method of the structure in FIGS. 27 to 29 is explained.

Initially, as shown in FIG. 30, fin-type stacked layer structures Fin 1 and Fin 2 are formed as in the processes carried out in the first embodiment (FIGS. 6 and 7).

Next, as shown in FIG. 31, block insulating layer 6, charge storage layer 7, tunnel insulating layer 8, and control gate electrode 9 are formed to cover fin-type stacked layer structures Fin 1 and Fin 2.

Then, control gate electrode 9 is patterned into lines and spaces extending in the third direction by anisotropy etching using, for example, a resist layer as a mask. Here, tunnel insulating layer 8, charge storage layer 7, and block insulating layer 6 may be patterned in addition to control gate electrode 9.

With the above-described processes, the structure shown in FIGS. 27 to 29 can be obtained.

(5) Conclusion

As can be understood from the above, the fourth embodiment can manufacture the nonvolatile semiconductor memory device with improved reliability as in the first embodiment. Furthermore, since charge storage layer 7 of memory cell MC is a charge trap layer, the structure and manufacturing process of the nonvolatile semiconductor memory device can be simplified.

5. Application Example

Now, considered is a case where the first to fourth embodiments are applied to, for example, a vertical gate ladder-bit const scalable memory (VLB).

FIGS. 32 and 33 are perspective views showing the VLB.

Fin-type stacked layer structures fin 1, fin 2, and fin 3 include active area layers 3*a*, 3*b*, and 3*c*, respectively. Note that four layers are stacked as the active area layers in the first and fourth embodiments and three layers are stacked as the active area layers in this example.

Vertical gate NAND (VG-NAND) includes memory strings Na, Nb, and Nc (FIG. 1) explained in the first to fourth embodiments.

Both ends of fin-type stacked layer structures fin 1, fin 2, and fin 3 along the second direction are connected to beams 11-1 and 11-2 extending in the third direction. Beams 11-1 and 11-2 include active area layers 3*a*, 3*b*, and 3*c* as with fin-type stacked layer structures fin 1, fin 2, and fin 3.

Note that active area layers 3*a*, 3*b*, and 3*c* within beam 11-1 have impurity regions 12*a*, 12*b*, and 12*c*, respectively and active area layers 3*a*, 3*b*, and 3*c* within beam 11-2 have impurity regions 14*a*, 14*b*, and 14*c*, respectively for the sake of low resistance.

The ends of beams 11-1 and 11-2 in the third direction function to select one of memory strings Na, Nb, and Nc.

In the example of FIG. 32, each of the ends of beams 11-1 and 11-2 in the third direction is in a stepped shape. Furthermore, bit lines BLa, BLb, and BLc are connected to active area layers 3*a*, 3*b*, and 3*c* within beam 11-1, respectively and independently, via contact plugs 13*a*, 13*b*, and 13*c*. Source line SL is connected to active areas 3*a*, 3*b*, and 3*c* within beam 11-2, respectively and independently.

In the example of FIG. 33, the ends of beams 11-1 and 11-2 in the third direction have common semiconductor layers 16-1 and 16-2 connected to all of active area layers 3*a*, 3*b*, and 3*c* and layer select transistors LSTa, LSTb, and LSTc.

Bit line BL is connected to common semiconductor layer 16-1 through contact plug 17-1 and source line SL is connected to common semiconductor layer 16-2 through contact plug 17-2.

Layer select transistors LSTa, LSTb, and LSTc include select gate electrodes SGa, SGb, and SGc.

Layer select transistor LSTa has impurity region 18*a* within active area layer 3*a* which is the lowermost layer among the three active area layers and is covered with select gate electrode SGa. Layer select transistor LSTb has impurity region 18*b* within active area layer 3*b* which is the intermediate layer among the three active area layers and is covered with select gate electrode SGb. Layer select transistor LSTc has impurity region 18*c* within active area layer 3*c* which is the uppermost layer among the three active area layers and is covered with select gate electrode SGc.

Thus, one of memory strings Na, Nb, and Nc (one active area layer from fin-type stacked layer structures fin 1, fin 2, and fin 3) can be selected.

6. Conclusion

With the above-described embodiments, the nonvolatile semiconductor memory device can be manufactured with improved reliability.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:

a semiconductor substrate;

a first stacked layer structure including first to $n^{th}$ semiconductor layers (n is a natural number greater than or equal to 2) stacked in a first direction perpendicular to a surface of the semiconductor substrate, and extending in a second direction parallel to the surface of the semiconductor substrate; and first to $n^{th}$ memory cells provided on surfaces of the first to $n^{th}$ semiconductor layers facing a third direction perpendicular to the first and second directions respectively, wherein the $i^{th}$ memory cell ($1 \leq i \leq n$) comprises a second stacked layer structure in which a first insulating layer, a charge storage layer, a second insulating layer, and a control gate electrode are stacked on the surface of the $i^{th}$ semiconductor layer facing the third direction, and the second insulating layer has an equivalent oxide thickness smaller than that of the first insulating layer.

2. The memory of claim 1, further comprising:

first to $n-1^{th}$ interlayer insulating layers isolating the first to nth semiconductor layers, wherein the $j^{th}$ interlayer insulating layer ($1 \leq j \leq n-1$) is provided between the $j^{th}$ and $j+1^{th}$ semiconductor layers, and the $j^{th}$ interlayer insulating layer has a first width wider than a second width of the $j^{th}$ and $j+1^{th}$ semiconductor layers in the third direction.

3. The memory of claim 2, wherein the $j^{th}$ interlayer insulating layer has a third width at its end in the third direction and a fourth width between the $j^{th}$ and $j+1^{th}$ semiconductor layers, each of the third and fourth widths is a width in the first direction, and the third width is narrower than the fourth width.

4. The memory of claim 3, wherein the first insulating layer covers the end of the $j^{th}$ interlayer insulating layer in the third direction and is provided in common with the first to nth memory cells.

5. The memory of claim 2, wherein the first insulating layer is provided only on a surface of the first to nth semiconductor layers facing the third direction.

6. The memory of claim 2, wherein the charge storage layer fills in one or more concave portions between the first to $n-1^{th}$ interlayer insulating layers.

7. The memory of claim 2, wherein the second insulating layer covers the first stacked layer structure.

8. The memory of claim 4, wherein the charge storage layer has a fifth width substantially equal to a sixth width of the first to $n^{th}$ semiconductor layers in the first direction.

9. The memory of claim 8, wherein the first insulating layer between the first to $N-1^{th}$ interlayer insulating layers and the charge storage layer has a seventh width substantially equal to a difference between the third and fourth widths in the first direction.

10. The memory of claim 1, further comprising:

first to $n-1^{th}$ interlayer insulating layers isolating the first to nth semiconductor layers, wherein the $j^{th}$ interlayer insulating layer ($1 \leq j \leq n-1$) is provided between the $j^{th}$ and semiconductor layers, and the $j^{th}$ interlayer insulating layer has a first width substantially equal to a second width of the $j^{th}$ and $j+1^{th}$ semiconductor layers in the third direction.

11. The memory of claim 10, wherein the first insulating layer, the charge storage layer and the second insulating layer cover the first stacked layer structure.

12. The memory of claim 11, wherein the first insulating layer, the charge storage layer, the second insulating layer and the control gate electrode extend in the first direction on a side surface of the first stacked layer structure in the third direction, and extend in the third direction when seeing from above the first stacked layer structure.

13. The memory of claim 1, wherein the $i^{th}$ memory cell executes a charge transfer between the charge storage layer and the control gate electrode in a write/erase operation, and cause a read current to the $i^{th}$ semiconductor layer in a read operation.

14. The memory of claim 13, wherein the write operation is executed by setting a potential of the $i^{th}$ semiconductor layer larger than a potential of the control gate electrode, and by transferring electrons from the control gate electrode to the charge storage layer, and the erase operation is executed by setting a potential of the $i^{th}$ semiconductor layer smaller than a potential of the control gate electrode, and by transferring electrons from the charge storage layer to the control gate electrode.

15. The memory of claim 1, wherein the charge storage layer is a floating gate electrode comprising a conductive layer in an electrically floating state.

16. The memory of claim 1, wherein the charge storage layer is a charge trap layer comprising an insulating layer trapping charges.

* * * * *